(12) United States Patent
Fusella et al.

(10) Patent No.: US 12,414,433 B2
(45) Date of Patent: Sep. 9, 2025

(54) ORGANIC ELECTROLUMINESCENT DEVICES

(71) Applicant: Universal Display Corporation, Ewing, NJ (US)

(72) Inventors: Michael Fusella, Lawrenceville, NJ (US); Nicholas J. Thompson, New Hope, PA (US); Michael Stuart Weaver, Princeton, NJ (US); Michael Hack, Carmel, CA (US)

(73) Assignee: Universal Display Corporation, Ewing, NJ (US)

( * ) Notice: Subject to any disclaimer, the term of this patent is extended or adjusted under 35 U.S.C. 154(b) by 411 days.

(21) Appl. No.: 18/105,377

(22) Filed: Feb. 3, 2023

(65) Prior Publication Data

US 2023/0263003 A1   Aug. 17, 2023

Related U.S. Application Data

(60) Provisional application No. 63/351,539, filed on Jun. 13, 2022, provisional application No. 63/309,312, filed on Feb. 11, 2022.

(51) Int. Cl.
| | |
|---|---|
| *H10K 50/824* | (2023.01) |
| *H10K 50/814* | (2023.01) |
| *H10K 50/858* | (2023.01) |
| *H10K 71/16* | (2023.01) |
| *H10K 102/00* | (2023.01) |

(52) U.S. Cl.
CPC ......... *H10K 50/824* (2023.02); *H10K 50/814* (2023.02); *H10K 50/858* (2023.02); *H10K 71/16* (2023.02); *H10K 2102/331* (2023.02)

(58) Field of Classification Search
None
See application file for complete search history.

(56) References Cited

U.S. PATENT DOCUMENTS

| | | | |
|---|---|---|---|
| 4,769,292 | A | 9/1988 | Tang |
| 5,061,569 | A | 10/1991 | VanSlyke |
| 5,247,190 | A | 9/1993 | Friend |
| 5,703,436 | A | 12/1997 | Forrest |
| 5,707,745 | A | 1/1998 | Forrest |
| 5,834,893 | A | 11/1998 | Bulovic |
| 5,844,363 | A | 12/1998 | Gu |
| 6,013,982 | A | 1/2000 | Thompson |
| 6,087,196 | A | 7/2000 | Sturm |

(Continued)

FOREIGN PATENT DOCUMENTS

| | | |
|---|---|---|
| CN | 103947003 | 7/2014 |
| EP | 0650955 | 5/1995 |

(Continued)

OTHER PUBLICATIONS

Korean Office Action Issued Dec. 22, 2020 In Corresponding Korean Patent Application No. 10-2017-7005221.

(Continued)

*Primary Examiner* — Anthony Ho
(74) *Attorney, Agent, or Firm* — Butzel Long

(57) ABSTRACT

Emissive devices are provided that include an outcoupling layer having a plurality of nanoparticles such that the outcoupling layer has at least 3 regions possessing distinct bulk refractive index values. One or more dielectric materials are arranged at least partially between the outcoupling layer and an emissive layer of the device.

20 Claims, 14 Drawing Sheets

(56) References Cited

U.S. PATENT DOCUMENTS

| | | |
|---|---|---|
| 6,091,195 A | 7/2000 | Forrest |
| 6,097,147 A | 8/2000 | Baldo |
| 6,294,398 B1 | 9/2001 | Kim |
| 6,303,238 B1 | 10/2001 | Thompson |
| 6,337,102 B1 | 1/2002 | Forrest |
| 6,468,819 B1 | 10/2002 | Kim |
| 6,528,187 B1 | 3/2003 | Okada |
| 6,537,688 B2 | 3/2003 | Silvernail |
| 6,597,111 B2 | 7/2003 | Silvernail |
| 6,664,137 B2 | 12/2003 | Weaver |
| 6,687,266 B1 | 2/2004 | Ma |
| 6,835,469 B2 | 12/2004 | Kwong |
| 6,835,950 B2 | 12/2004 | Brown |
| 6,888,305 B2 | 5/2005 | Weaver |
| 6,888,307 B2 | 5/2005 | Silvernail |
| 6,897,474 B2 | 5/2005 | Brown |
| 6,921,915 B2 | 7/2005 | Takiguchi |
| 7,087,321 B2 | 8/2006 | Kwong |
| 7,090,928 B2 | 8/2006 | Thompson |
| 7,154,114 B2 | 12/2006 | Brooks |
| 7,187,119 B2 | 3/2007 | Weaver |
| 7,250,226 B2 | 7/2007 | Tokito |
| 7,279,704 B2 | 10/2007 | Walters |
| 7,332,232 B2 | 2/2008 | Ma |
| 7,338,722 B2 | 3/2008 | Thompson |
| 7,393,599 B2 | 7/2008 | Thompson |
| 7,396,598 B2 | 7/2008 | Takeuchi |
| 7,431,968 B1 | 10/2008 | Shtein |
| 7,445,855 B2 | 11/2008 | Mackenzie |
| 7,534,505 B2 | 5/2009 | Lin |
| 7,683,534 B2 | 3/2010 | Weaver |
| 7,750,352 B2 | 7/2010 | Thurk |
| 7,968,146 B2 | 6/2011 | Wagner |
| 8,557,400 B2 | 10/2013 | Xia |
| 9,263,689 B2 | 2/2016 | O'Carroll |
| 9,318,721 B2 | 4/2016 | Carroll |
| 9,865,768 B2 | 1/2018 | Liu |
| 9,960,386 B2 | 5/2018 | Thompson |
| 10,403,854 B2 | 9/2019 | Thompson |
| 10,522,787 B1 | 12/2019 | Montgomery |
| 10,600,980 B1 | 3/2020 | Boardman |
| 10,663,631 B2 | 5/2020 | Mikkelsen |
| 11,056,540 B2 | 7/2021 | Thompson |
| 11,139,442 B2 | 10/2021 | Fusella |
| 11,201,313 B2 | 12/2021 | Fusella |
| 11,245,086 B2 | 2/2022 | Menon |
| 11,569,480 B2 | 1/2023 | Fusella |
| 2002/0034656 A1 | 3/2002 | Thompson |
| 2002/0134984 A1 | 9/2002 | Igarashi |
| 2002/0158242 A1 | 10/2002 | Son |
| 2003/0138657 A1 | 7/2003 | Li |
| 2003/0152802 A1 | 8/2003 | Tsuboyama |
| 2003/0162053 A1 | 8/2003 | Marks |
| 2003/0175553 A1 | 9/2003 | Thompson |
| 2003/0230980 A1 | 12/2003 | Forrest |
| 2004/0036077 A1 | 2/2004 | Ise |
| 2004/0137267 A1 | 7/2004 | Igarashi |
| 2004/0137268 A1 | 7/2004 | Igarashi |
| 2004/0174116 A1 | 9/2004 | Lu |
| 2005/0025993 A1 | 2/2005 | Thompson |
| 2005/0035346 A1 | 2/2005 | Bazan |
| 2005/0112407 A1 | 5/2005 | Ogasawara |
| 2005/0238919 A1 | 10/2005 | Ogasawara |
| 2005/0244673 A1 | 11/2005 | Satoh |
| 2005/0260441 A1 | 11/2005 | Thompson |
| 2005/0260449 A1 | 11/2005 | Walters |
| 2006/0008670 A1 | 1/2006 | Lin |
| 2006/0202194 A1 | 9/2006 | Jeong |
| 2006/0240279 A1 | 10/2006 | Adamovich |
| 2006/0251923 A1 | 11/2006 | Lin |
| 2006/0263635 A1 | 11/2006 | Ise |
| 2006/0280965 A1 | 12/2006 | Kwong |
| 2007/0190359 A1 | 8/2007 | Knowles |
| 2007/0278938 A1 | 12/2007 | Yabunouchi |
| 2007/0289623 A1 | 12/2007 | Atwater |
| 2008/0015355 A1 | 1/2008 | Schafer |
| 2008/0018221 A1 | 1/2008 | Egen |
| 2008/0106190 A1 | 5/2008 | Yabunouchi |
| 2008/0124572 A1 | 5/2008 | Mizuki |
| 2008/0220265 A1 | 9/2008 | Xia |
| 2008/0297033 A1 | 12/2008 | Knowles |
| 2009/0008605 A1 | 1/2009 | Kawamura |
| 2009/0009065 A1 | 1/2009 | Nishimura |
| 2009/0017330 A1 | 1/2009 | Iwakuma |
| 2009/0030202 A1 | 1/2009 | Iwakuma |
| 2009/0039776 A1 | 2/2009 | Yamada |
| 2009/0045730 A1 | 2/2009 | Nishimura |
| 2009/0045731 A1 | 2/2009 | Nishimura |
| 2009/0101870 A1 | 4/2009 | Prakash |
| 2009/0108737 A1 | 4/2009 | Kwong |
| 2009/0115316 A1 | 5/2009 | Zheng |
| 2009/0121619 A1 | 5/2009 | Rajan |
| 2009/0165846 A1 | 7/2009 | Johannes |
| 2009/0167162 A1 | 7/2009 | Lin |
| 2009/0179554 A1 | 7/2009 | Kuma |
| 2011/0037057 A1 | 2/2011 | Lecloux |
| 2011/0248249 A1 | 10/2011 | Forrest |
| 2012/0025172 A1 | 2/2012 | Smigelski, Jr. |
| 2012/0132930 A1 | 5/2012 | Young |
| 2013/0063023 A1 | 3/2013 | Pan |
| 2013/0146878 A1 | 6/2013 | Oh |
| 2013/0153861 A1 | 6/2013 | Kaminska |
| 2014/0042422 A1 | 2/2014 | Silverman |
| 2014/0225086 A1 | 8/2014 | Dobbertin |
| 2014/0225091 A1 | 8/2014 | O'Carroll |
| 2014/0230884 A1 | 8/2014 | Shapira |
| 2015/0041780 A1 | 2/2015 | Ma |
| 2015/0129851 A1 | 5/2015 | Lee |
| 2017/0018741 A1 | 1/2017 | Osawa |
| 2017/0077425 A1 | 3/2017 | Ma |
| 2017/0133631 A1 | 5/2017 | Thompson |
| 2017/0229663 A1 | 8/2017 | Tsai |
| 2017/0299784 A1 | 10/2017 | Mikkelsen |
| 2017/0324057 A1 | 11/2017 | Friend |
| 2019/0081248 A1 | 3/2019 | Lin |
| 2020/0176700 A1 | 6/2020 | Fusella |
| 2020/0295093 A1 | 9/2020 | Thompson |
| 2021/0249633 A1 | 8/2021 | Fusella |
| 2022/0013731 A1 | 1/2022 | Lin |
| 2022/0181561 A1 | 6/2022 | Fleetham |

FOREIGN PATENT DOCUMENTS

| | | |
|---|---|---|
| EP | 1725079 | 11/2006 |
| EP | 2034538 | 3/2009 |
| EP | 3168890 A1 | 5/2017 |
| JP | 2005011610 | 1/2005 |
| JP | 2007123392 | 5/2007 |
| JP | 2007254297 | 10/2007 |
| JP | 2008074939 | 4/2008 |
| JP | 2012528434 | 11/2012 |
| JP | 2014514716 | 6/2014 |
| JP | 2015502037 | 1/2015 |
| JP | 2021039951 | 12/2020 |
| KR | 1020120013770 | 2/2012 |
| WO | 0139234 | 5/2001 |
| WO | 0202714 | 1/2002 |
| WO | 02015645 | 2/2002 |
| WO | 03040257 | 5/2003 |
| WO | 03060956 | 7/2003 |
| WO | 2004093207 | 10/2004 |
| WO | 2004107822 | 12/2004 |
| WO | 2005014551 | 2/2005 |
| WO | 2005019373 | 3/2005 |
| WO | 2005030900 | 4/2005 |
| WO | 2005089025 | 9/2005 |
| WO | 2005123873 | 12/2005 |
| WO | 2006009024 | 1/2006 |
| WO | 2006056418 | 6/2006 |
| WO | 2006072002 | 7/2006 |
| WO | 2006082742 | 8/2006 |
| WO | 2006095951 | 9/2006 |
| WO | 2006098120 | 9/2006 |
| WO | 2006100298 | 9/2006 |

(56) References Cited

FOREIGN PATENT DOCUMENTS

| WO | 2006103874 | | 10/2006 |
|---|---|---|---|
| WO | 2006114966 | | 11/2006 |
| WO | 2006132173 | | 12/2006 |
| WO | 2007002683 | | 1/2007 |
| WO | 2007004380 | | 1/2007 |
| WO | 2007063754 | | 6/2007 |
| WO | 2007063796 | | 6/2007 |
| WO | 2008056746 | | 5/2008 |
| WO | 2008057394 | A1 | 5/2008 |
| WO | 2008101842 | | 8/2008 |
| WO | 2008132085 | | 11/2008 |
| WO | 2009000673 | | 12/2008 |
| WO | 2009003898 | | 1/2009 |
| WO | 2009008311 | | 1/2009 |
| WO | 2009018009 | | 2/2009 |
| WO | 2009021126 | | 2/2009 |
| WO | 2009050290 | | 4/2009 |
| WO | 2009062578 | | 5/2009 |
| WO | 2009063833 | | 5/2009 |
| WO | 2009066778 | | 5/2009 |
| WO | 2009066779 | | 5/2009 |
| WO | 2009086028 | | 7/2009 |
| WO | 2009100991 | | 8/2009 |
| WO | 2010011390 | A2 | 1/2010 |
| WO | 2010112799 | | 10/2010 |
| WO | 2016108990 | | 7/2016 |
| WO | 2016108990 | A2 | 7/2016 |
| WO | 2020036278 | | 2/2020 |

OTHER PUBLICATIONS

Kim, Do Weon, (Officer/International Searching Authority—KR) International Search Report dated Nov. 13, 2015 issued in corresponding PCT International Patent Application No. PCT/US2015/042071, pp. 1-2.

Japanese Office Action (with English translation) issued in App. No. JP2021-131078, dated Jul. 19, 2022, 10 pages.

Akselrod et al., "Probing the mechanisms of large Purcell enhancement in plasmonic nanoantennas", nature photonics, published online Oct. 12, 2014, p. 1-6.

Atzrodt et al., "The Renaissance of H/D Exchange", Angewandte Chemie, Angew. Chem. Int. Ed. 2007, 46, 7744-7765.

George et al., "Electrically tunable diffraction efficiency from gratings in Al-doped ZnO", Applied Physics Letters 110, 071110, 2017.

Hu et al., "A convenient synthesis of deuterium labeled amines and nitrogen heterocycles with KOt-Bu/DMSO-d6", Elsevier, Tetrahedron 71, 2015, 1425-1430.

Lassiter et al., "Plasmonic waveguide modes of film-coupled metallic nanocubes", Nano Letters, 201, 3, 13, 5866-5872downloaded via Universal Display Corp on Aug. 31, 2018, https://pubs.acs.org/sharingguidelines.

European Extended Search Report issued in EP20162531.6, dated Jul. 10, 2020, 9 pages.

In-Hwan Lee et al: "Performance enhancement of GaN-based light emitting diodes by the interaction with localized surface plasmons", Nano Energy, vol. 13, Apr. 1, 2015 (Apr. 1, 2015), pp. 140-173, XP055708113, ISSN: 2211-2855.

Kevin C.Y. Huang et al: "Antenna electrodes for controlling electroluminescence", Nature Communications, vol. 3, Aug. 14, 2012 (Aug. 14, 2012), p. 1005.

Adachi et al., "Nearly 100% Internal Phosphorescence Efficiency in an Organic Light Emitting Device," J. Appl. Phys., vol. 90, No. 10, 5048-5051 (2001).

Adachi, Chihaya et al., "High-Efficiency Red Electrophosphorescence Devices," Appl. Phys. Lett., 78(11):1622-1624 (2001).

Aonuma, Masaki et al., "Material Design of Hole Transport Materials Capable of Thick-Film Formation in Organic Light Emitting Diodes," Appl. Phys. Lett., 90, Apr. 30, 2007, 183503-1-183503-3.

Gao, Zhiqiang et al., "Bright-Blue Electroluminescence From a Silyl-Substituted ter-(phenylene-vinylene) derivative," Appl. Phys. Lett., 74(6):865-867 (1999).

Guo, Tzung-Fang et al., "Highly Efficient Electrophosphorescent Polymer Light-Emitting Devices," Organic Electronics, 1:15-20 (2000).

Hu, Nan-Xing et al., "Novel High Tg Hole-Transport Molecules Based on Indolo[3,2-b]carbazoles for Organic Light-Emitting Devices," Synthetic Metals, 111-112:421-424 (2000).

Huang, Wei-Sheng et al., "Highly Phosphorescent Bis-Cyclometalated Iridium Complexes Containing Benzoimidazole-Based Ligands," Chem. Mater., 16(12):2480-2488 (2004).

Hung, L.S. et al., "Anode Modification in Organic Light-Emitting Diodes by Low-Frequency Plasma Polymerization of CHF3," Appl. Phys. Lett., 78(5):673-675 (2001).

Ikai, Masamichi and Tokito, Shizuo, "Highly Efficient Phosphorescence From Organic Light-Emitting Devices with an Exciton-Block Layer," Appl. Phys. Lett., 79(2):156-158 (2001).

Ikeda, Hisao et al., "P-185: Low-Drive-Voltage OLEDs with a Buffer Layer Having Molybdenum Oxide," SID Symposium Digest, 37:923-926 (2006).

Inada, Hiroshi and Shirota, Yasuhiko, "1,3,5-Tris[4-(diphenylamino)phenyl]benzene and its Methylsubstituted Derivatives as a Novel Class of Amorphous Molecular Materials," J. Mater. Chem., 3(3):319-320 (1993).

Kanno, Hiroshi et al., "Highly Efficient and Stable Red Phosphorescent Organic Light-Emitting Device Using bis[2-(2-benzothiazoyl)phenolato]zinc(II) as host material," Appl. Phys. Lett., 90:123509-1-123509-3 (2007).

Kido, Junji et al., "1,2,4-Triazole Derivative as an Electron Transport Layer in Organic Electroluminescent Devices", Jpn. J. Appl. Phys., 32:L917-L920 (1993).

Kwong et al., "High Operational Stability of Electrophosphorescent Devices," Appl. Phys. Lett., vol. 81, No. 1, 162-164 (2002).

Lamansky, Sergey et al., "Synthesis and Characterization of Phosphorescent Cyclometalated Iridium Complexes," Inorg. Chem., 40(7):1704-1711 (2001).

Lo, Shih-Chun et al., "Blue Phosphorescence from Iridium(III) Complexes at Room Temperature," Chem. Mater., 18(21):5119-5129 (2006).

Ma, Yuguang et al., "Triplet Luminescent Dinuclear-Gold(/) Complex-Based Light-Emitting Diodes with Low Turn-On voltage," Appl. Phys. Lett, 74(10):1361-1363 (1999).

Nishida, Jun-ichi et al., "Preparation, Characterization, and Electroluminescence Characteristics of alpha-Diimine-type Platinum(II) Complexes with Perfluorinated Phenyl Groups as Ligands," Chem. Lett., 34(4):592-593 (2005).

Noda, Tetsuya and Shirota, Yasuhiko, "5,5'-Bis(dimesitylboryl)-2,2'-bithiophene and 5,5"-Bis(dimesitylboryl)-2,2':5',2"-terthiophene as a Novel Family of Electron-Transporting Amorphous Molecular Materials," J. Am. Chem. Soc., 120(37):9714-9715 (1998).

Okumoto, Kenji et al., "Green Fluorescent Organic Light-Emitting Device with External Quantum Efficiency of Nearly 10%," Appl. Phys. Lett., 89:063504-1-063504-3 (2006).

Palilis, Leonidas C., "High Efficiency Molecular Organic Light-Emitting Diodes Based on Silole Derivatives and Their Exciplexes," Organic Electronics, 4:113-121 (2003).

Paulose, Betty Marie Jennifer S. et al., "First Examples of Alkenyl Pyridines as Organic Ligands for Phosphorescent Iridium Complexes," Adv. Mater., 16(22):2003-2007 (2004).

Ranjan, Sudhir et al., "Realizing Green Phosphorescent Light-Emitting Materials from Rhenium(I) Pyrazolato Diimine Complexes," Inorg. Chem., 42(4):1248-1255 (2003).

Salbeck, J. et al., "Low Molecular Organic Glasses for Blue Electroluminescence," Synthetic Metals, 91:209-215 (1997).

Shirota, Yasuhiko et al., "Starburst Molecules Based on pi-Electron Systems as Materials for Organic Electroluminescent Devices," Journal of Luminescence, 72-74:985-991 (1997).

Sotoyama, Wataru et al., "Efficient Organic Light-Emitting Diodes with Phosphorescent Platinum Complexes containing NACAN-Coordinating Tridentate Ligand," Appl. Phys. Lett., 86:153505-1-153505-3 (2005).

(56) References Cited

OTHER PUBLICATIONS

Sun, Yiru and Forrest, Stephen R., "High-Efficiency White Organic Light Emitting Devices with Three Separate Phosphorescent Emission Layers," Appl. Phys. Lett., 91:263503-1-263503-3 (2007).
T. Ostergard et al., "Langmuir-Blodgett Light-Emitting Diodes Of Poly(3-Hexylthiophene) Electra-Optical Characteristics Related to Structure," Synthetic Metals, 88:171-177 (1997).
Takizawa, Shin-ya et al., "Phosphorescent Iridium Complexes Based on 2-Phenylimidazo[1,2-a]pyridine Ligands Tuning of Emission Color toward the Blue Region and Application to Polymer Light-Emitting Devices," Inorg. Chem., 16(10):4308-4319 (2007).
Tang, C.W. and VanSlyke, S.A., "Organic Electroluminescent Diodes," Appl. Phys. Lett., 51(12):913-915 (1987).
Tung, Yung-Liang et al., "Organic Light-Emitting Diodes Based on Charge-Neutral Rull PHosphorescent Emitters," Adv. Mater., 17(8):1059-1064 (2005).
Wong, Keith Man-Chung et al., A Novel Class of Phosphorescent Gold(III) Alkynyl-Based Organic Light-Emitting Devices with Tunable Colour, Chem. Commun., 2906-2908 (2005).
Wong, Wai-Yeung, "Multifunctional Iridium Complexes Based on Carbazole Modules as Highly Efficient Electrophosphors," Angew. Chem. Int. Ed., 45:7800-7803 (2006).
Adachi, Chihaya et al., "Organic Electroluminescent Device Having a Hole Conductor as an Emitting Layer," Appl. Phys. Lett., 55(15):1489-1491 (1989).
Hamada, Yuji et al., "High Luminance in Organic Electroluminescent Devices with Bis(10-hydroxybenzo[h]quinolinato)beryllium as an Emitter," Chem. Lett., 905-906 (1993).
Holmes, R.J. et al., "Blue Organic Electrophosphorescence Using Exothermic Host-Guest Energy Transfer," Appl. Phys. Lett., 82(15):2422-2424 (2003).
Huang, Jinsong et al., "Highly Efficient Red-Emission Polymer Phosphorescent Light-Emitting Diodes Based on Two Novel Tris(1-phenylisoquinolinato-C2,N)iridium(III) Derivatives," Adv. Mater., 19:739-743 (2007).
Kuwabara, Yoshiyuki et al., "Thermally Stable Multilayered Organic Electroluminescent Devices Using Novel Starburst Molecules, 4,4',4"-Tri(N-carbazolyl)triphenylamine (TCTA) and 4,4',4"-Tris(3-methylphenylphenyl-amino) triphenylamine (m-MTDATA), as Hole-Transport Materials," Adv. Mater., 6(9):677-679 (1994).
Lee, Chang-Lyoul et al., "Polymer Phosphorescent Light-Emitting Devices Doped with Tris(2-phenylpyridine) Iridium as a Triplet Emitter," Appl. Phys. Lett., 77(15):2280-2282 (2000).
Baldo et al. "Highly efficient phosphorescent emission from organic electroluminescent devices", Nature, vol. 395, pp. 151-154, 1998.
Baldo, et al., "Very high-efficiency green organic light-emitting devices based on electrophosphorescence", Applied Physics Letters, Jul. 5, 1999, 4 pp., vol. 75, No. 1, American Institute of Physics, Melville, NY, USA.
Mi, Bao-Xiu et al., "Thermally Stable Hole-Transporting Material for Organic Light-Emitting Diode: an Isoindole Derivative," Chem. Mater., 15(16):3148-3151 (2003).
Sakamoto, Youichi et al., "Synthesis, Characterization, and Electron-Transport Property of Perfluorinated Phenylene Dendrimers," J. Am. Chem. Soc., 122(8):1832-1833 (2000).
Van Slyke, S. A. et al., "Organic Electroluminescent Devices with Improved Stability," Appl. Phys. Lett., 69(15 ):2160-2162 (1996).
Wang, Y. et al., "Highly Efficient Electroluminescent Materials Based on Fluorinated Organometallic Iridium Compounds," Appl. Phys. Lett., 79(4):449-451 (2001).
Extended European Search Report for App. No. EP21183691.1, dated Dec. 6, 2021, 10 pages.
Huang Kevin C yet al: "Supplementary Information: Antenna-electrodes for controlling electroluminescence", Nature Communications 3, 1005 (2012), Aug. 14, 2012 (Aug. 14, 2012), XP055866309, DOI: 10.1038/ncomms1985 Retrieved from the Internet: URL:https://static-content.springer.com/esm/art%3A10.1038%2Fncomms1985/MediaObjects/41467_2012_BFncomms1985_MOESM1009_ESM.pdf [retrieved on Nov. 26, 2021].

Kroger M et al: "P-type doping of organic wide band gap materials by transition metal oxides: A case-study on Molybdenum trioxide", Organic Electronics, Elsevier, Amsterdam, NL, vol. 10, No. 5, Aug. 1, 2009 (Aug. 1, 2009), pp. 932-938, XP026235906, ISSN: 1566-1199, DOI: 10.1016/J.ORGEL.2009.05.007.
Markus Gantenbein et al: "New 4,4'-Bis(9-carbazolyl)-Biphenyl Derivatives with Locked Carbazole-Biphenyl Junctions: High-Triplet State Energy Materials", Chemistry of Materials, vol. 27, No. 5, Mar. 10, 2015 (Mar. 10, 2015), pp. 1772-1779, XP055191916, ISSN: 0897-4756, DOI: 10.1021/cm5045754.
Ting Zhang et al: "A CBP derivative as bipolar host for performance enhancement in phosphorescent organic light-emitting diodes", Journal of Materials Chemistry C, vol. 1, No. 4, Jan. 1, 2013 (Jan. 1, 2013), pp. 757-764, XP055191881, ISSN: 2050-7526, DOI: 10.1039/C2TC00305H.
Jung-Hwan Park et al: "New Bipolar Green Host Materials Containing Benzimidazole-Carbazole Moiety in Phosphorescent OLEDs", Bulletin of the Korean Chemical Society, vol. 32, No. 3, Mar. 20, 2011 (Mar. 20, 2011), pp. 841-846, XP055191890, ISSN: 0253-2964, DOI: 10.5012/bkcs.2011.32.3.841.
Namdas Ebinazar et al: "Simple color tuning of phosphorescent dendrimer light emitting diodes", Applied Physics Letters, A I P Publishing LLC, US, vol. 86, No. 16, Apr. 11, 2005 (Apr. 11, 2005), pp. 161104-161104, XP012065079, ISSN: 0003-6951, DOI: 10.1063/1.1899256.
European Patent Office Communication pursuant to Article 94(3) EPC issued in App. No. EP20162531.6, dated May 2, 2022, 10 pages.
Hong Wonbin et al: "Optically Invisible Antenna Integrated Within an OLED Touch Display Panel for IoT Applications", IEEE Transactions on Antennas and Propagation, IEEE, USA, vol. 65, No. 7, Jul. 1, 2017 (Jul. 1, 2017), pp. 3750-3755, XP011655742, ISSN: 0018-926X, DOI: 10.1109/TAP.2017.2705127 [retrieved on Jul. 3, 2017].
Hong Wonbin et al: "Invisible antennas using mesoscale conductive polymer wires embedded within OLED displays", 2017 11th European Conference on Antennas and Propagation (EUCAP), EURAAP, Mar. 19, 2017 (Mar. 19, 2017), pp. 2809-2811, XP033097565, DOI: 10.23919/EUCAP.2017.7928446 [retrieved on May 15, 2017].
Extended European Search Report issued in App. No. EP22150265.1, dated May 31, 2022, 10 pages.
Yook, K. S., Chin, B. D., Lee, J. Y., Lassiter, B. E., and Forrest, S. R. "Vertical Orientation of Copper Phthalocyanine in Organic Solar Cells Using a Small Molecular Weight Organic Templating Layer," Appl. Phys. Lett. 99, 043308 (2011).
Rand, B. P., Cheyns, D. Vasseur, K., Giebink, N. C., Mothy, S., Yi, Y., Coropceanu, V., Beljonne, D., Cornil, J., Bredas, J.- L., Genoe, J. "The impact of Molecular Orientation on the Photovoltaic Properties of a Phthalocyanine/Fullerene Heterojunction" Adv. Funct. Mater. 2012, 22, 2987-2995.
Barnes, W. L. "Fluorescence near interfaces: the role of photonic mode density" J. Mod. Opt. 1998, 45, 4, 661-699.
Niu, Yu-Hua et al., "Highly Efficient Electrophosphorescent Devices with Saturated Red Emission from a Neutral Osmium Complex," Chem. Mater., 17(13):3532-3536 (2005).
Wang et al, "Enhanced performance of solution-processed OLEDs by altering the molecular transition dipole moment orientation of emission layers", 2022, Spectrochimica Acta Part A: Molecular and Biomolecular Spectroscopy 271 pp. 1-6 (Year: 2022).
Bradley et al., "Transition from discrete patches to plasmonic nanohole array by glancing angle deposition on hanosphere monolayers", Nanotechnology, 31, 2020, 9 pages.
Fusella et al., "Homoepitaxy of crystalline rubrene thin films", Nano Letters, 2017, 17, 3040-3046.
Zuo et al., "Deposition of Ag nanoparticles on fluoroalkylsilane self-assembled monolayers with varying chain length", Surface Science, 602, 2008, 3750-3759.
Han et al., "Physical vapor deposition of Ag nanoparticles through shadowing and re-emission effects", J. Vac. Sci. Technology B, 36(5), Sep./Oct. 2018, 7 pages.
Stefaniuk et al., "Optimum deposition conditions of ultrasmooth silver nanolayers", Nanoscale Research Letters, 2014, 9:153, 9 pages.

Glass/Ag(10 nm)

RMS roughness = 5.2 nm

Glass/Ca(1 nm)/Ag(10 nm)

RMS roughness = 1.8 nm

Ag @ 0.05 Å/s

RMS roughness = 2.5 nm

Ag @ 2 Å/s

RMS roughness = 1.9 nm

Hollow cathode sputtering

Facing target sputtering

ORGANIC ELECTROLUMINESCENT DEVICES

FIELD

The present invention relates to arrangements for light emitting diodes that include in-plane variation in refractive index and devices and techniques for fabricating such devices, such as organic light emitting diodes, and devices and techniques including the same.

BACKGROUND

Opto-electronic devices that make use of organic materials are becoming increasingly desirable for a number of reasons. Many of the materials used to make such devices are relatively inexpensive, so organic opto-electronic devices have the potential for cost advantages over inorganic devices. In addition, the inherent properties of organic materials, such as their flexibility, may make them well suited for particular applications such as fabrication on a flexible substrate. Examples of organic opto-electronic devices include organic light emitting diodes/devices (OLEDs), organic phototransistors, organic photovoltaic cells, and organic photodetectors. For OLEDs, the organic materials may have performance advantages over conventional materials. For example, the wavelength at which an organic emissive layer emits light may generally be readily tuned with appropriate dopants.

OLEDs make use of thin organic films that emit light when voltage is applied across the device. OLEDs are becoming an increasingly interesting technology for use in applications such as flat panel displays, illumination, and backlighting. Several OLED materials and configurations are described in U.S. Pat. Nos. 5,844,363, 6,303,238, and 5,707,745, which are incorporated herein by reference in their entirety.

One application for phosphorescent emissive molecules is a full color display. Industry standards for such a display call for pixels adapted to emit particular colors, referred to as "saturated" colors. In particular, these standards call for saturated red, green, and blue pixels. Alternatively the OLED can be designed to emit white light. In conventional liquid crystal displays emission from a white backlight is filtered using absorption filters to produce red, green and blue emission. The same technique can also be used with OLEDs. The white OLED can be either a single EML device or a stack structure. Color may be measured using CIE coordinates, which are well known to the art.

As used herein, the term "organic" includes polymeric materials as well as small molecule organic materials that may be used to fabricate organic opto-electronic devices. "Small molecule" refers to any organic material that is not a polymer, and "small molecules" may actually be quite large. Small molecules may include repeat units in some circumstances. For example, using a long chain alkyl group as a substituent does not remove a molecule from the "small molecule" class. Small molecules may also be incorporated into polymers, for example as a pendent group on a polymer backbone or as a part of the backbone. Small molecules may also serve as the core moiety of a dendrimer, which consists of a series of chemical shells built on the core moiety. The core moiety of a dendrimer may be a fluorescent or phosphorescent small molecule emitter. A dendrimer may be a "small molecule," and it is believed that all dendrimers currently used in the field of OLEDs are small molecules.

As used herein, "top" means furthest away from the substrate, while "bottom" means closest to the substrate. Where a first layer is described as "disposed over" a second layer, the first layer is disposed further away from substrate. There may be other layers between the first and second layer, unless it is specified that the first layer is "in contact with" the second layer. For example, a cathode may be described as "disposed over" an anode, even though there are various organic layers in between.

As used herein, "solution processible" means capable of being dissolved, dispersed, or transported in and/or deposited from a liquid medium, either in solution or suspension form.

A ligand may be referred to as "photoactive" when it is believed that the ligand directly contributes to the photoactive properties of an emissive material. A ligand may be referred to as "ancillary" when it is believed that the ligand does not contribute to the photoactive properties of an emissive material, although an ancillary ligand may alter the properties of a photoactive ligand.

As used herein, and as would be generally understood by one skilled in the art, a first "Highest Occupied Molecular Orbital" (HOMO) or "Lowest Unoccupied Molecular Orbital" (LUMO) energy level is "greater than" or "higher than" a second HOMO or LUMO energy level if the first energy level is closer to the vacuum energy level. Since ionization potentials (IP) are measured as a negative energy relative to a vacuum level, a higher HOMO energy level corresponds to an IP having a smaller absolute value (an IP that is less negative). Similarly, a higher LUMO energy level corresponds to an electron affinity (EA) having a smaller absolute value (an EA that is less negative). On a conventional energy level diagram, with the vacuum level at the top, the LUMO energy level of a material is higher than the HOMO energy level of the same material. A "higher" HOMO or LUMO energy level appears closer to the top of such a diagram than a "lower" HOMO or LUMO energy level.

As used herein, and as would be generally understood by one skilled in the art, a first work function is "greater than" or "higher than" a second work function if the first work function has a higher absolute value. Because work functions are generally measured as negative numbers relative to vacuum level, this means that a "higher" work function is more negative. On a conventional energy level diagram, with the vacuum level at the top, a "higher" work function is illustrated as further away from the vacuum level in the downward direction. Thus, the definitions of HOMO and LUMO energy levels follow a different convention than work functions.

Layers, materials, regions, and devices may be described herein in reference to the color of light they emit. In general, as used herein, an emissive region that is described as producing a specific color of light may include one or more emissive layers disposed over each other in a stack.

As used herein, a "red" layer, material, region, or device refers to one that emits light in the range of about 580-700 nm or having a highest peak in its emission spectrum in that region. Similarly, a "green" layer, material, region, or device refers to one that emits or has an emission spectrum with a peak wavelength in the range of about 500-600 nm; a "blue" layer, material, or device refers to one that emits or has an emission spectrum with a peak wavelength in the range of about 400-500 nm; and a "yellow" layer, material, region, or device refers to one that has an emission spectrum with a peak wavelength in the range of about 540-600 nm. In some arrangements, separate regions, layers, materials, regions, or devices may provide separate "deep blue" and a "light blue" light. As used herein, in arrangements that provide separate "light blue" and "deep blue", the "deep blue" component refers to one having a peak emission wavelength that is at least about 4 nm less than the peak emission wavelength of the "light blue" component. Typically, a "light blue" component has a peak emission wavelength in the range of about 465-500 nm, and a "deep blue" component has a peak emission wavelength in the range of about 400-470 nm, though these ranges may vary for some configurations. Similarly, a color altering layer refers to a layer that converts or modifies another color of light to light having a wavelength as specified for that color. For example, a "red" color filter refers to a filter that results in light having a wavelength in the range of about 580-700 nm. In general, there are two classes of color altering layers: color filters that modify a spectrum by removing unwanted wavelengths of light, and color changing layers that convert photons of higher energy to lower energy. A component "of a color" refers to a component that, when activated or used, produces or otherwise emits light having a particular color as previously described. For example, a "first emissive region of a first color" and a "second emissive region of a second color different than the first color" describes two emissive regions that, when activated within a device, emit two different colors as previously described.

As used herein, emissive materials, layers, and regions may be distinguished from one another and from other structures based upon light initially generated by the material, layer or region, as opposed to light eventually emitted by the same or a different structure. The initial light generation typically is the result of an energy level change resulting in emission of a photon. For example, an organic emissive material may initially generate blue light, which may be converted by a color filter, quantum dot or other structure to red or green light, such that a complete emissive stack or sub-pixel emits the red or green light. In this case the initial emissive material or layer may be referred to as a "blue" component, even though the sub-pixel is a "red" or "green" component.

In some cases, it may be preferable to describe the color of a component such as an emissive region, sub-pixel, color altering layer, or the like, in terms of 1931 CIE coordinates. For example, a yellow emissive material may have multiple peak emission wavelengths, one in or near an edge of the "green" region, and one within or near an edge of the "red" region as previously described. Accordingly, as used herein, each color term also corresponds to a shape in the 1931 CIE coordinate color space. The shape in 1931 CIE color space is constructed by following the locus between two color points and any additional interior points. For example, interior shape parameters for red, green, blue, and yellow may be defined as shown below:

| Color | CIE Shape Parameters |
| --- | --- |
| Central Red | Locus: [0.6270, 0.3725]; [0.7347, 0.2653]; Interior: [0.5086, 0.2657] |
| Central Green | Locus: [0.0326, 0.3530]; [0.3731, 0.6245]; Interior: [0.2268, 0.3321 |
| Central Blue | Locus: [0.1746, 0.0052]; [0.0326, 0.3530]; Interior: [0.2268, 0.3321] |
| Central Yellow | Locus: [0.373 1, 0.6245]; [0.6270, 0.3725]; Interior: [0.3 700, 0.4087]; [0.2886, 0.4572] |

More details on OLEDs, and the definitions described above, can be found in U.S. Pat. No. 7,279,704, which is incorporated herein by reference in its entirety.

SUMMARY

According to an embodiment, an organic light emitting diode/device (OLED) is also provided. The OLED can include an anode, a cathode, and an organic layer, disposed between the anode and the cathode. According to an embodiment, the organic light emitting device is incorporated into one or more device selected from a consumer product, an electronic component module, and/or a lighting panel.

DETAILED DESCRIPTION

Generally, an OLED comprises at least one organic layer disposed between and electrically connected to an anode and a cathode. When a current is applied, the anode injects holes and the cathode injects electrons into the organic layer(s). The injected holes and electrons each migrate toward the oppositely charged electrode. When an electron and hole localize on the same molecule, an "exciton," which is a localized electron-hole pair having an excited energy state, is formed. Light is emitted when the exciton relaxes via a photoemissive mechanism. In some cases, the exciton may be localized on an excimer or an exciplex. Non-radiative mechanisms, such as thermal relaxation, may also occur, but are generally considered undesirable.

The initial OLEDs used emissive molecules that emitted light from their singlet states ("fluorescence") as disclosed, for example, in U.S. Pat. No. 4,769,292, which is incorporated by reference in its entirety. Fluorescent emission generally occurs in a time frame of less than 10 nanoseconds.

More recently, OLEDs having emissive materials that emit light from triplet states ("phosphorescence") have been demonstrated. Baldo et al., "Highly Efficient Phosphorescent Emission from Organic Electroluminescent Devices," Nature, vol. 395, 151-154, 1998; ("Baldo-I") and Baldo et al., "Very high-efficiency green organic light-emitting devices based on electrophosphorescence," Appl. Phys. Lett., vol. 75, No. 3, 4-6 (1999) ("Baldo-II"), are incorporated by reference in their entireties. Phosphorescence is described in more detail in U.S. Pat. No. 7,279,704 at cols. 5-6, which are incorporated by reference.

Figure 1:
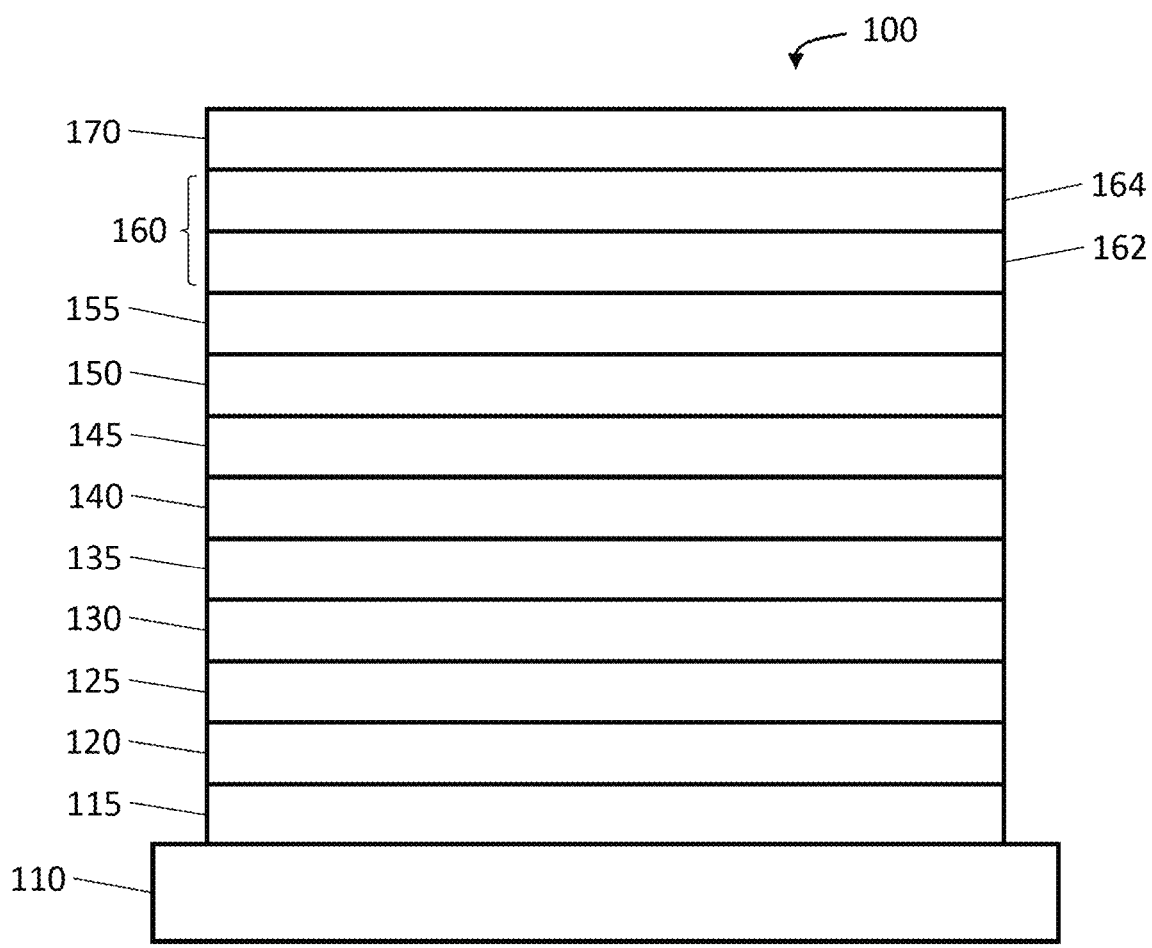
FIG. 1 shows an organic light emitting device.

FIG. 1 shows an organic light emitting device 100. The figures are not necessarily drawn to scale. Device 100 may include a substrate 110, an anode 115, a hole injection layer 120, a hole transport layer 125, an electron blocking layer 130, an emissive layer 135, a hole blocking layer 140, an electron transport layer 145, an electron injection layer 150, a protective layer 155, a cathode 160, and a barrier layer 170. Cathode 160 is a compound cathode having a first conductive layer 162 and a second conductive layer 164. Device 100 may be fabricated by depositing the layers described, in order. The properties and functions of these various layers, as well as example materials, are described in more detail in U.S. Pat. No. 7,279,704 at cols. 6-10, which are incorporated by reference.

More examples for each of these layers are available. For example, a flexible and transparent substrate-anode combination is disclosed in U.S. Pat. No. 5,844,363, which is incorporated by reference in its entirety. An example of a p-doped hole transport layer is m-MTDATA doped with $F_4$-TCNQ at a molar ratio of 50:1, as disclosed in U.S. Patent Application Publication No. 2003/0230980, which is incorporated by reference in its entirety. Examples of emissive and host materials are disclosed in U.S. Pat. No. 6,303,238 to Thompson et al., which is incorporated by reference in its entirety. An example of an n-doped electron transport layer is BPhen doped with Li at a molar ratio of 1:1, as disclosed in U.S. Patent Application Publication No. 2003/0230980, which is incorporated by reference in its entirety. U.S. Pat. Nos. 5,703,436 and 5,707,745, which are incorporated by reference in their entireties, disclose examples of cathodes including compound cathodes having a thin layer of metal such as Mg:Ag with an overlying transparent, electrically-conductive, sputter-deposited ITO layer. The theory and use of blocking layers is described in more detail in U.S. Pat. No. 6,097,147 and U.S. Patent Application Publication No. 2003/0230980, which are incorporated by reference in their entireties. Examples of injection layers are provided in U.S. Patent Application Publication No. 2004/0174116, which is incorporated by reference in its entirety. Barrier layer 170 may be a single- or multi-layer barrier and may cover or surround the other layers of the device. The barrier layer 170 may also surround the substrate 110, and/or it may be arranged between the substrate and the other layers of the device. The barrier also may be referred to as an encapsulant, encapsulation layer, protective layer, or permeation barrier, and typically provides protection against permeation by moisture, ambient air, and other similar materials through to the other layers of the device. Examples of barrier layer materials and structures are provided in U.S. Pat. Nos. 6,537,688, 6,597,111, 6,664,137, 6,835,950, 6,888,305, 6,888,307, 6,897,474, 7,187,119, and 7,683,534, each of which is incorporated by reference in its entirety.

Figure 2:
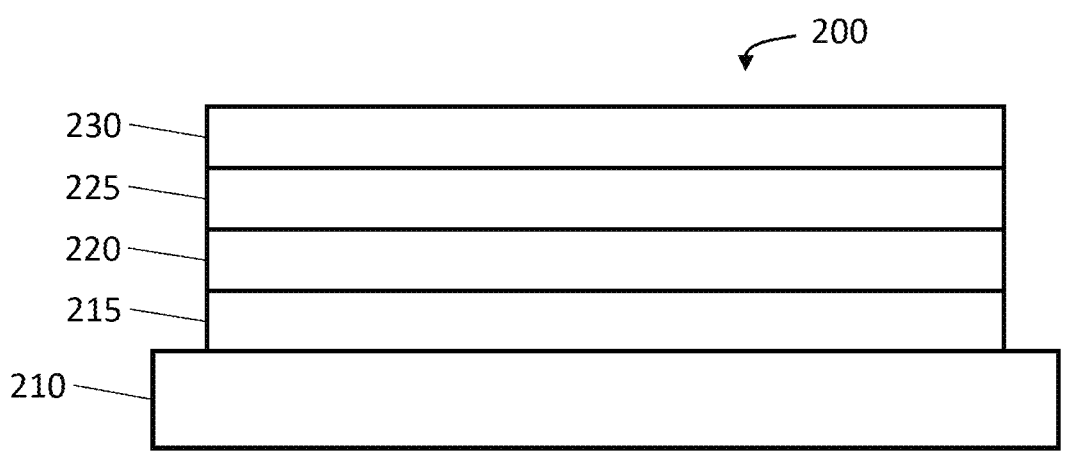
FIG. 2 shows an inverted organic light emitting device that does not have a separate electron transport layer.

FIG. 2 shows an inverted OLED 200. The device includes a substrate 210, a cathode 215, an emissive layer 220, a hole transport layer 225, and an anode 230. Device 200 may be fabricated by depositing the layers described, in order. Because the most common OLED configuration has a cathode disposed over the anode, and device 200 has cathode 215 disposed under anode 230, device 200 may be referred to as an "inverted" OLED. Materials similar to those described with respect to device 100 may be used in the corresponding layers of device 200. FIG. 2 provides one example of how some layers may be omitted from the structure of device 100.

The simple layered structure illustrated in FIGS. 1 and 2 is provided by way of non-limiting example, and it is understood that embodiments of the invention may be used in connection with a wide variety of other structures. The specific materials and structures described are exemplary in nature, and other materials and structures may be used. Functional OLEDs may be achieved by combining the various layers described in different ways, or layers may be omitted entirely, based on design, performance, and cost factors. Other layers not specifically described may also be included. Materials other than those specifically described may be used. Although many of the examples provided herein describe various layers as comprising a single material, it is understood that combinations of materials, such as a mixture of host and dopant, or more generally a mixture, may be used. Also, the layers may have various sublayers. The names given to the various layers herein are not intended to be strictly limiting. For example, in device 200, hole transport layer 225 transports holes and injects holes into emissive layer 220, and may be described as a hole transport layer or a hole injection layer. In one embodiment, an OLED may be described as having an "organic layer" disposed between a cathode and an anode. This organic layer may comprise a single layer, or may further comprise multiple layers of different organic materials as described, for example, with respect to FIGS. 1 and 2.

Structures and materials not specifically described may also be used, such as OLEDs comprised of polymeric materials (PLEDs) such as disclosed in U.S. Pat. No. 5,247,190 to Friend et al., which is incorporated by reference in its entirety. By way of further example, OLEDs having a single organic layer may be used. OLEDs may be stacked, for example as described in U.S. Pat. No. 5,707,745 to Forrest et al, which is incorporated by reference in its entirety. The OLED structure may deviate from the simple layered structure illustrated in FIGS. 1 and 2. For example, the substrate may include an angled reflective surface to improve outcoupling, such as a mesa structure as described in U.S. Pat. No. 6,091,195 to Forrest et al., and/or a pit structure as described in U.S. Pat. No. 5,834,893 to Bulovic et al., which are incorporated by reference in their entireties.

In some embodiments disclosed herein, emissive layers or materials, such as emissive layer 135 and emissive layer 220 shown in FIGS. 1-2, respectively, may include quantum dots. An "emissive layer" or "emissive material" as disclosed herein may include an organic emissive material and/or an emissive material that contains quantum dots or equivalent structures, unless indicated to the contrary explicitly or by context according to the understanding of one of skill in the art. In general, an emissive layer includes emissive material within a host matrix. Such an emissive layer may include only a quantum dot material which converts light emitted by a separate emissive material or other emitter, or it may also include the separate emissive material or other emitter, or it may emit light itself directly from the application of an electric current. Similarly, a color altering layer, color filter, upconversion, or downconversion layer or structure may include a material containing quantum dots, though such layer may not be considered an "emissive layer" as disclosed herein. In general, an "emissive layer" or material is one that emits an initial light based on an injected electrical charge, where the initial light may be altered by another layer such as a color filter or other color altering layer that does not itself emit an initial light within the device, but may reemit altered light of a different spectra content based upon absorption of the initial light emitted by the emissive layer and downconversion to a lower energy light emission. In some embodiments disclosed herein, the color altering layer, color filter, upconversion, and/or downconversion layer may be disposed outside of an OLED device, such as above or below an electrode of the OLED device.

Unless otherwise specified, any of the layers of the various embodiments may be deposited by any suitable method. For the organic layers, preferred methods include thermal evaporation, ink-jet, such as described in U.S. Pat. Nos. 6,013,982 and 6,087,196, which are incorporated by reference in their entireties, organic vapor phase deposition (OVPD), such as described in U.S. Pat. No. 6,337,102 to Forrest et al., which is incorporated by reference in its entirety, and deposition by organic vapor jet printing (OVJP), such as described in U.S. Pat. No. 7,431,968, which is incorporated by reference in its entirety. Other suitable deposition methods include spin coating and other solution based processes. Solution based processes are preferably carried out in nitrogen or an inert atmosphere. For the other layers, preferred methods include thermal evaporation. Preferred patterning methods include deposition through a mask, cold welding such as described in U.S. Pat. Nos. 6,294,398 and 6,468,819, which are incorporated by reference in their entireties, and patterning associated with some of the deposition methods such as ink-jet and OVJD. Other methods may also be used. The materials to be deposited may be modified to make them compatible with a particular deposition method. For example, substituents such as alkyl and aryl groups, branched or unbranched, and preferably containing at least 3 carbons, may be used in small molecules to enhance their ability to undergo solution processing. Substituents having 20 carbons or more may be used, and 3-20 carbons is a preferred range. Materials with asymmetric structures may have better solution processability than those having symmetric structures, because asymmetric materials may have a lower tendency to recrystallize. Dendrimer substituents may be used to enhance the ability of small molecules to undergo solution processing.

Devices fabricated in accordance with embodiments of the present invention may further optionally comprise a barrier layer. One purpose of the barrier layer is to protect the electrodes and organic layers from damaging exposure to harmful species in the environment including moisture, vapor and/or gases, etc. The barrier layer may be deposited over, under or next to a substrate, an electrode, or over any other parts of a device including an edge. The barrier layer may comprise a single layer, or multiple layers. The barrier layer may be formed by various known chemical vapor deposition techniques and may include compositions having a single phase as well as compositions having multiple phases. Any suitable material or combination of materials may be used for the barrier layer. The barrier layer may incorporate an inorganic or an organic compound or both. The preferred barrier layer comprises a mixture of a polymeric material and a non-polymeric material as described in U.S. Pat. No. 7,968,146, PCT Pat. Application Nos. PCT/US2007/023098 and PCT/US2009/042829, which are herein incorporated by reference in their entireties. To be considered a "mixture", the aforesaid polymeric and non-polymeric materials comprising the barrier layer should be deposited under the same reaction conditions and/or at the same time. The weight ratio of polymeric to non-polymeric material may be in the range of 95:5 to 5:95. The polymeric material and the non-polymeric material may be created from the same precursor material. In one example, the mixture of a polymeric material and a non-polymeric material consists essentially of polymeric silicon and inorganic silicon.

In some embodiments, at least one of the anode, the cathode, or a new layer disposed over the organic emissive layer functions as an enhancement layer. The enhancement layer comprises a plasmonic material exhibiting surface plasmon resonance that non-radiatively couples to the emitter material and transfers excited state energy from the emitter material to non-radiative mode of surface plasmon polariton. The enhancement layer is provided no more than a threshold distance away from the organic emissive layer, wherein the emitter material has a total non-radiative decay rate constant and a total radiative decay rate constant due to the presence of the enhancement layer and the threshold distance is where the total non-radiative decay rate constant is equal to the total radiative decay rate constant. In some embodiments, the OLED further comprises an outcoupling layer. In some embodiments, the outcoupling layer is disposed over the enhancement layer on the opposite side of the organic emissive layer. In some embodiments, the outcoupling layer is disposed on opposite side of the emissive layer from the enhancement layer but still outcouples energy from the surface plasmon mode of the enhancement layer. The outcoupling layer scatters the energy from the surface plasmon polaritons. In some embodiments this energy is scattered as photons to free space. In other embodiments, the energy is scattered from the surface plasmon mode into other modes of the device such as but not limited to the organic waveguide mode, the substrate mode, or another waveguiding mode. If energy is scattered to the non-free space mode of the OLED other outcoupling schemes could be incorporated to extract that energy to free space. In some embodiments, one or more intervening layer can be disposed between the enhancement layer and the outcoupling layer. The examples for intervening layer(s) can be dielectric materials, including organic, inorganic, perovskites, oxides, and may include stacks and/or mixtures of these materials.

The enhancement layer modifies the effective properties of the medium in which the emitter material resides resulting in any or all of the following: a decreased rate of emission, a modification of emission line-shape, a change in emission intensity with angle, a change in the stability of the emitter material, a change in the efficiency of the OLED, and reduced efficiency roll-off of the OLED device. Placement of the enhancement layer on the cathode side, anode side, or on both sides results in OLED devices which take advantage of any of the above-mentioned effects. In addition to the specific functional layers mentioned herein and illustrated in the various OLED examples shown in the figures, the OLEDs according to the present disclosure may include any of the other functional layers often found in OLEDs.

The enhancement layer can be comprised of plasmonic materials, optically active metamaterials, or hyperbolic metamaterials. As used herein, a plasmonic material is a material in which the real part of the dielectric constant crosses zero in the visible or ultraviolet region of the electromagnetic spectrum. In some embodiments, the plasmonic material includes at least one metal. In such embodiments the metal may include at least one of Ag, Al, Au, Ir, Pt, Ni, Cu, W, Ta, Fe, Cr, Mg, Ga, Rh, Ti, Ru, Pd, In, Bi, Ca alloys or mixtures of these materials, and stacks of these materials. In general, a metamaterial is a medium composed of different materials where the medium as a whole acts differently than the sum of its material parts. In particular, we define optically active metamaterials as materials which have both negative permittivity and negative permeability. Hyperbolic metamaterials, on the other hand, are anisotropic media in which the permittivity or permeability are of different sign for different spatial directions. Optically active metamaterials and hyperbolic metamaterials are strictly distinguished from many other photonic structures such as Distributed Bragg Reflectors ("DBRs") in that the medium should appear uniform in the direction of propagation on the length scale of the wavelength of light. Using terminology that one skilled in the art can understand: the dielectric constant of the metamaterials in the direction of propagation can be described with the effective medium approximation. Plasmonic materials and metamaterials provide methods for controlling the propagation of light that can enhance OLED performance in a number of ways.

In some embodiments, the enhancement layer is provided as a planar layer. In other embodiments, the enhancement layer has wavelength-sized features that are arranged periodically, quasi-periodically, or randomly, or sub-wavelength-sized features that are arranged periodically, quasi-periodically, or randomly. In some embodiments, the wavelength-sized features and the sub-wavelength-sized features have sharp edges.

In some embodiments, the outcoupling layer has wavelength-sized features that are arranged periodically, quasi-periodically, or randomly, or sub-wavelength-sized features that are arranged periodically, quasi-periodically, or randomly. In some embodiments, the outcoupling layer may be composed of a plurality of nanoparticles and in other embodiments the outcoupling layer is composed of a plurality of nanoparticles disposed over a material. In these embodiments the outcoupling may be tunable by at least one of varying a size of the plurality of nanoparticles, varying a shape of the plurality of nanoparticles, changing a material of the plurality of nanoparticles, adjusting a thickness of the material, changing the refractive index of the material or an additional layer disposed on the plurality of nanoparticles, varying a thickness of the enhancement layer, and/or varying the material of the enhancement layer. The plurality of nanoparticles of the device may be formed from at least one of metal, dielectric material, semiconductor materials, an alloy of metal, a mixture of dielectric materials, a stack or layering of one or more materials, and/or a core of one type of material and that is coated with a shell of a different type of material. In some embodiments, the outcoupling layer is composed of at least metal nanoparticles wherein the metal is selected from the group consisting of Ag, Al, Au, Ir, Pt, Ni, Cu, W, Ta, Fe, Cr, Mg, Ga, Rh, Ti, Ru, Pd, In, Bi, Ca, alloys or mixtures of these materials, and stacks of these materials. The plurality of nanoparticles may have additional layer disposed over them. In some embodiments, the polarization of the emission can be tuned using the outcoupling layer. Varying the dimensionality and periodicity of the outcoupling layer can select a type of polarization that is preferentially outcoupled to air. In some embodiments the outcoupling layer also acts as an electrode of the device.

It is believed that the internal quantum efficiency (IQE) of fluorescent OLEDs can exceed the 25% spin statistics limit through delayed fluorescence. As used herein, there are two types of delayed fluorescence, i.e. P-type delayed fluorescence and E-type delayed fluorescence. P-type delayed fluorescence is generated from triplet-triplet annihilation (TTA).

On the other hand, E-type delayed fluorescence does not rely on the collision of two triplets, but rather on the thermal population between the triplet states and the singlet excited states. Compounds that are capable of generating E-type delayed fluorescence are required to have very small singlet-triplet gaps. Thermal energy can activate the transition from the triplet state back to the singlet state. This type of delayed fluorescence is also known as thermally activated delayed fluorescence (TADF). A distinctive feature of TADF is that the delayed component increases as temperature rises due to the increased thermal energy. If the reverse intersystem crossing rate is fast enough to minimize the non-radiative decay from the triplet state, the fraction of back populated singlet excited states can potentially reach 75%. The total singlet fraction can be 100%, far exceeding the spin statistics limit for electrically generated excitons.

E-type delayed fluorescence characteristics can be found in an exciplex system or in a single compound. Without being bound by theory, it is believed that E-type delayed fluorescence requires the luminescent material to have a small singlet-triplet energy gap ($\Delta E_{S-T}$). Organic, non-metal containing, donor-acceptor luminescent materials may be able to achieve this. The emission in these materials is often characterized as a donor-acceptor charge-transfer (CT) type emission. The spatial separation of the HOMO and LUMO in these donor-acceptor type compounds often results in small $\Delta E_{S-T}$. These states may involve CT states. Often, donor-acceptor luminescent materials are constructed by connecting an electron donor moiety such as amino- or carbazole-derivatives and an electron acceptor moiety such as N-containing six-membered aromatic ring.

Devices fabricated in accordance with embodiments of the invention can be incorporated into a wide variety of electronic component modules (or units) that can be incorporated into a variety of electronic products or intermediate components. Examples of such electronic products or intermediate components include display screens, lighting devices such as discrete light source devices or lighting panels, etc. that can be utilized by the end-user product manufacturers. Such electronic component modules can optionally include the driving electronics and/or power source(s). Devices fabricated in accordance with embodiments of the invention can be incorporated into a wide variety of consumer products that have one or more of the electronic component modules (or units) incorporated therein. A consumer product comprising an OLED that includes the compound of the present disclosure in the organic layer in the OLED is disclosed. Such consumer products would include any kind of products that include one or more light source(s) and/or one or more of some type of visual displays. Some examples of such consumer products include a flat panel display, a curved display, a computer monitor, a medical monitor, a television, a billboard, a light for interior or exterior illumination and/or signaling, a heads-up display, a fully or partially transparent display, a flexible display, a rollable display, a foldable display, a stretchable display, a laser printer, a telephone, a cell phone, a tablet, a phablet, a personal digital assistant (PDA), a wearable device, a laptop computer, a digital camera, a camcorder, a viewfinder, a micro-display that is less than 2 inches diagonal, a 3-D display, a virtual reality or augmented reality display, a vehicle, a video walls comprising multiple displays tiled together, a theater or stadium screen, signs, AR/VR displays, displays or visual elements in glasses or contact lenses (e.g. micro LEDs combined with sapphire chips), OLED or LED wallpaper, OLED or LED jewelry and clothing. Various control mechanisms may be used to control devices fabricated in accordance with the present invention, including passive matrix and active matrix. Many of the devices are intended for use in a temperature range comfortable to humans, such as 18 C to 30 C, and more preferably at room temperature (20-25 C), but could be used outside this temperature range, for example, from −40 C to 80 C.

The materials and structures described herein may have applications in devices other than OLEDs. For example, other optoelectronic devices such as organic solar cells and organic photodetectors may employ the materials and structures. More generally, organic devices, such as organic transistors, may employ the materials and structures.

In some embodiments, the OLED has one or more characteristics selected from the group consisting of being flexible, being rollable, being foldable, being stretchable, and being curved. In some embodiments, the OLED is transparent or semi-transparent. In some embodiments, the OLED further comprises a layer comprising carbon nanotubes.

In some embodiments, the OLED further comprises a layer comprising a delayed fluorescent emitter. In some embodiments, the OLED comprises a RGB pixel arrangement or white plus color filter pixel arrangement. In some embodiments, the OLED is a mobile device, a hand held device, or a wearable device. In some embodiments, the OLED is a display panel having less than 10 inch diagonal or 50 square inch area. In some embodiments, the OLED is a display panel having at least 10 inch diagonal or 50 square inch area. In some embodiments, the OLED is a lighting panel.

In some embodiments of the emissive region, the emissive region further comprises a host.

In some embodiments, the compound can be an emissive dopant. In some embodiments, the compound can produce emissions via phosphorescence, fluorescence, thermally activated delayed fluorescence, i.e., TADF (also referred to as E-type delayed fluorescence), triplet-triplet annihilation, or combinations of these processes.

The OLED disclosed herein can be incorporated into one or more of a consumer product, an electronic component module, and a lighting panel. The organic layer can be an emissive layer and the compound can be an emissive dopant in some embodiments, while the compound can be a non-emissive dopant in other embodiments.

The organic layer can also include a host. In some embodiments, two or more hosts are preferred. In some embodiments, the hosts used maybe a) bipolar, b) electron transporting, c) hole transporting or d) wide band gap materials that play little role in charge transport. In some embodiments, the host can include a metal complex. The host can be an inorganic compound.

Combination with Other Materials

The materials described herein as useful for a particular layer in an organic light emitting device may be used in combination with a wide variety of other materials present in the device. For example, emissive dopants disclosed herein may be used in conjunction with a wide variety of hosts, transport layers, blocking layers, injection layers, electrodes and other layers that may be present. The materials described or referred to below are non-limiting examples of materials that may be useful in combination with the compounds disclosed herein, and one of skill in the art can readily consult the literature to identify other materials that may be useful in combination.

Various materials may be used for the various emissive and non-emissive layers and arrangements disclosed herein. Examples of suitable materials are disclosed in U.S. Patent Application Publication No. 2017/0229663, which is incorporated by reference in its entirety.

Conductivity Dopants:

A charge transport layer can be doped with conductivity dopants to substantially alter its density of charge carriers, which will in turn alter its conductivity. The conductivity is increased by generating charge carriers in the matrix material, and depending on the type of dopant, a change in the Fermi level of the semiconductor may also be achieved. Hole-transporting layer can be doped by p-type conductivity dopants and n-type conductivity dopants are used in the electron-transporting layer.

HIL/HTL:

A hole injecting/transporting material to be used in the present invention is not particularly limited, and any compound may be used as long as the compound is typically used as a hole injecting/transporting material.

EBL:

An electron blocking layer (EBL) may be used to reduce the number of electrons and/or excitons that leave the emissive layer. The presence of such a blocking layer in a device may result in substantially higher efficiencies, and or longer lifetime, as compared to a similar device lacking a blocking layer. Also, a blocking layer may be used to confine emission to a desired region of an OLED. In some embodiments, the EBL material has a higher LUMO (closer to the vacuum level) and/or higher triplet energy than the emitter closest to the EBL interface. In some embodiments, the EBL material has a higher LUMO (closer to the vacuum level) and or higher triplet energy than one or more of the hosts closest to the EBL interface. In one aspect, the compound used in EBL contains the same molecule or the same functional groups used as one of the hosts described below.

Host:

The light emitting layer of the organic EL device of the present invention preferably contains at least a metal complex as light emitting material, and may contain a host material using the metal complex as a dopant material. Examples of the host material are not particularly limited, and any metal complexes or organic compounds may be used as long as the triplet energy of the host is larger than that of the dopant. Any host material may be used with any dopant so long as the triplet criteria is satisfied.

HBL:

A hole blocking layer (HBL) may be used to reduce the number of holes and/or excitons that leave the emissive layer. The presence of such a blocking layer in a device may result in substantially higher efficiencies and/or longer lifetime as compared to a similar device lacking a blocking layer. Also, a blocking layer may be used to confine emission to a desired region of an OLED. In some embodiments, the HBL material has a lower HOMO (further from the vacuum level) and or higher triplet energy than the emitter closest to the HBL interface. In some embodiments, the HBL material has a lower HOMO (further from the vacuum level) and or higher triplet energy than one or more of the hosts closest to the HBL interface.

ETL:

An electron transport layer (ETL) may include a material capable of transporting electrons. The electron transport layer may be intrinsic (undoped), or doped. Doping may be used to enhance conductivity. Examples of the ETL material are not particularly limited, and any metal complexes or organic compounds may be used as long as they are typically used to transport electrons.

Charge Generation Layer (CGL)

In tandem or stacked OLEDs, the CGL plays an essential role in the performance, which is composed of an n-doped layer and a p-doped layer for injection of electrons and holes, respectively. Electrons and holes are supplied from the CGL and electrodes. The consumed electrons and holes in the CGL are refilled by the electrons and holes injected from the cathode and anode, respectively; then, the bipolar currents reach a steady state gradually. Typical CGL materials include n and p conductivity dopants used in the transport layers.

Light emitting diodes, such as the OLEDs disclosed herein, may achieve improved device stability by increasing the emitter decay rate by coupling the excited state energy into the surface plasmon mode of a nearby enhancement layer, usually the metal cathode. To do this, the recombination zone is located within a threshold distance of the enhancement layer. An example threshold distance is defined as the distance at which a total non-radiative decay rate constant is equal to a total radiative decay rate constant, as described further in U.S. Pat. Nos. 9,960,386 and 10,403,854, the disclosure of each of which is incorporated by reference in its entirety.

Figures 3A, 3B:
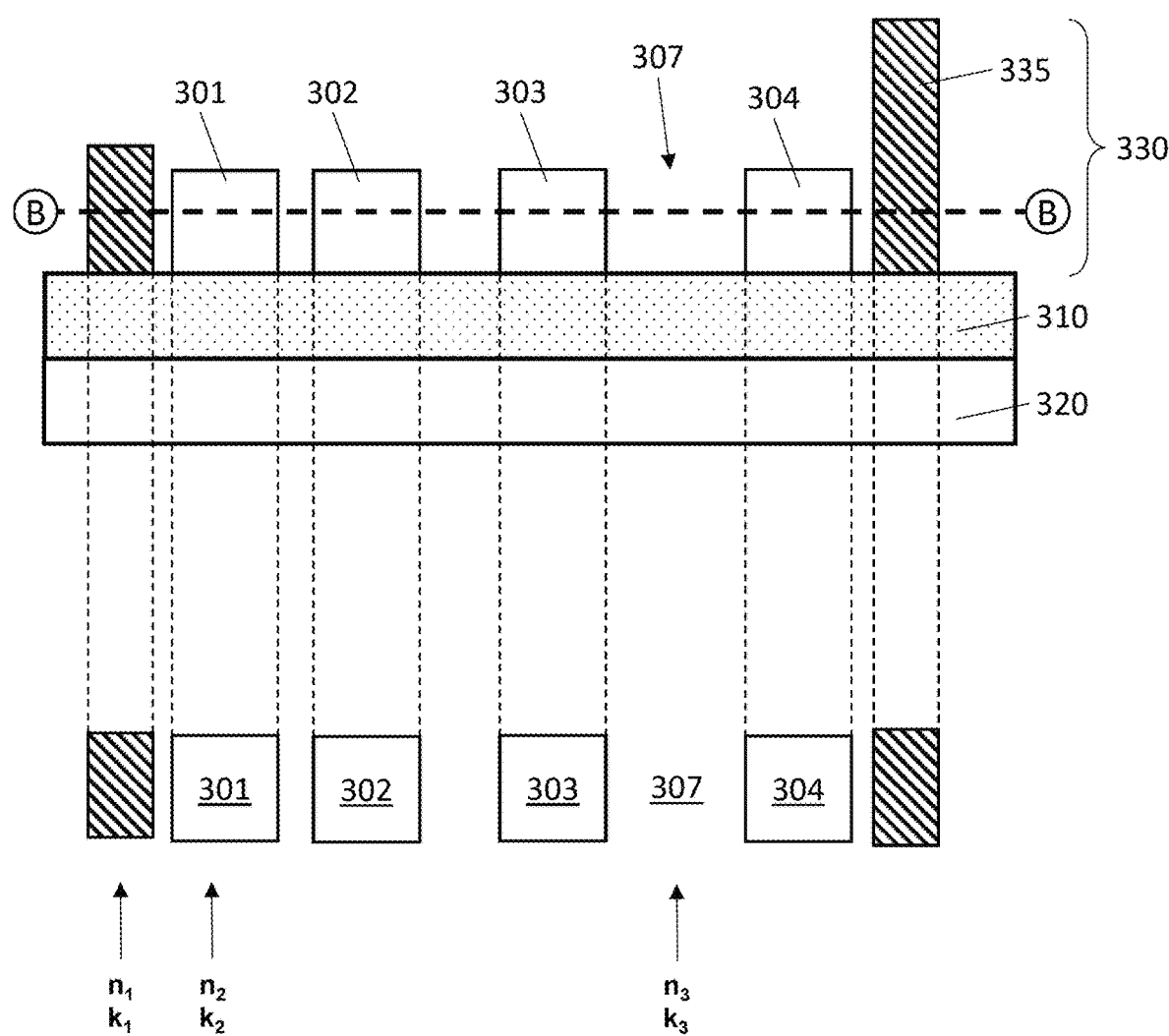
FIG. 3A shows an arrangement as disclosed herein which includes an outcoupling layer and a dielectric layer.
FIG. 3B shows areas of varying bulk refractive index of the arrangement shown in FIG. 3A.

A nanoparticle-based outcoupling scheme as disclosed herein may incorporate the enhancement layer, typically a thin film of metal, often the cathode, and a dielectric layer with an outcoupling later that includes nanoparticles. The dielectric layer spaces the nanoparticles a certain distance from the enhancement layer, and the nanoparticles themselves disposed over the dielectric layer. FIGS. 3A, 3C, 3E, 3H, and 3K show arrangements that include a dielectric layer 310, an enhancement layer 320, and an outcoupling layer 330 as disclosed herein, which may be a part of, or used in conjunction with, an organic or inorganic diode structure. FIG. 3A shows an example in which the dielectric layer is essentially planar. FIG. 3B is a top view of the same structure taken through line B-B in FIG. 3A, which shows regions having different refractive indices. FIG. 3B is aligned vertically with FIG. 3A for ease of comparison. The structure includes an enhancement layer 320 as disclosed herein, such as a metal film, which may be the cathode of an OLED or similar device. A dielectric layer 310 is disposed between the enhancement layer 320 and an outcoupling layer 330 that includes a plurality of nanoparticles 301, 302, 303, 304, and regions 307 that are filled with air, Nitrogen, or other filler material suitable for use in the outcoupling layer 330. The outcoupling layer 330 may include regions of other material 335, such as the same material as in the dielectric layer 310 or another dielectric. In comparison to the rest of the outcoupling layer 330, regions of the additional material 335 may have a different refractive index, may include different sub-units, stacks, porous materials, or the like, or may include dielectric nanoparticles. The additional material regions 335 also may include nanoparticles of different materials than in the rest of the outcoupling layer, or a material to help form the nanoparticles such as via PVD. More generally, it may be any other material. Preferred materials may include dielectric materials and nanoparticles having different composition than the nanoparticles 301, 302, 303, 304.

As used herein, the "outcoupling layer" may be considered to be bounded by the bottom-most portion of the lowest nanoparticle (i.e., the edge of any nanoparticle closest to the substrate) and the upper-most portion of the highest nanoparticle (i.e., the edge of any nanoparticle farthest from the substrate) or, if the nanoparticles are embedded in another outcoupling material, the edge boundaries of that material. As shown in FIG. 3B, the outcoupling layer includes three or more regions that have different bulk refractive indices. As used in the art, the "bulk" refractive index refers to the refractive index of a material or combination of materials measured in bulk form. The refractive index of a material is often expressed in the form n+ik, where n and k represent the real and imaginary part of the refractive index, respectively. Because refractive index is dependent on wavelength, most generally the refractive index can be described as $n(\lambda)=n(\lambda)+ik(\lambda)$.

The refractive index of a material can be measured using a neat solid or a continuous thin film of the material that has a spatial extent at least 10 times the wavelength of light used to measure the index of refraction. For example, the refractive index of a material can be measured using variable angle ellipsometry on a thin film deposited on a silicon wafer, where the film of material to be characterized is 100-500 nm thick. The measured may be done using white light that contains wavelengths from 200 nm to 1600 nm. For this measurement, the lateral extent of the thin film should be larger than 10 micrometers to interrogate the bulk refractive index.

A material also may be described by its dielectric constant $\varepsilon(\omega)=\varepsilon_1(\omega)+i\varepsilon_2(\omega)$, but at optical frequencies the most common convention is to utilize the refractive index as described above. Furthermore, the "bulk refractive index" is also used to describe various regions since the interaction of electromagnetic waves with the medium is most important. For regions that are only composed of one material, using the single physical material would be as effective of a description. However, for materials that are alloys or mixtures with physical components smaller than the wavelength of light that may not be uniformly dispersed, the refractive index of the bulk material as described above is a more precise optical definition of such regions compared to the material composition of the region(s).

For example, referring again to FIG. 3B, the region containing the additional material in the outcoupling layer 330 may have a bulk refractive index defined by $n_1$ and $k_1$; the region containing a nanoparticle 301, 302, 303, 304 may have a bulk refractive index defined by $n_2$ and $k_2$ different from those of the outcoupling layer 335; and the region 307 containing neither may have a bulk refractive index defined by $n_3$ and $k_3$ different from those of both the additional material 335 and the nanoparticles 301, 302, 303, 304. For example, the bulk refractive index of $n_3$ and $k_3$ may be those of air or $N_2$. There may be additional regions having different bulk refractive indices and/or dielectric constants than those three. For example, more than one type of nanoparticle may be used having different bulk refractive indices or additional dielectric materials 335 may be included in the outcoupling layer. More generally, an outcoupling layer as disclosed herein may have three or more regions within the layer, each of which has a different bulk refractive index and/or dielectric constant than some or all of the others. Preferably, the outcoupling layer 330 includes at least three regions, each having a different bulk refractive index than each of the others. That is, there is at least one plane parallel to the substrate that passes through three such regions in the outcoupling layer or the outcoupling layer and the dielectric layer. As used herein, when an outcoupling layer is described as having a number of regions of different bulk refractive index, this means that at least one such plane can be identified. Such an arrangement also may be referred to as having in-plane variation of the bulk refractive index, or a refractive index that varies in-plane.

Figures 3C, 3D:
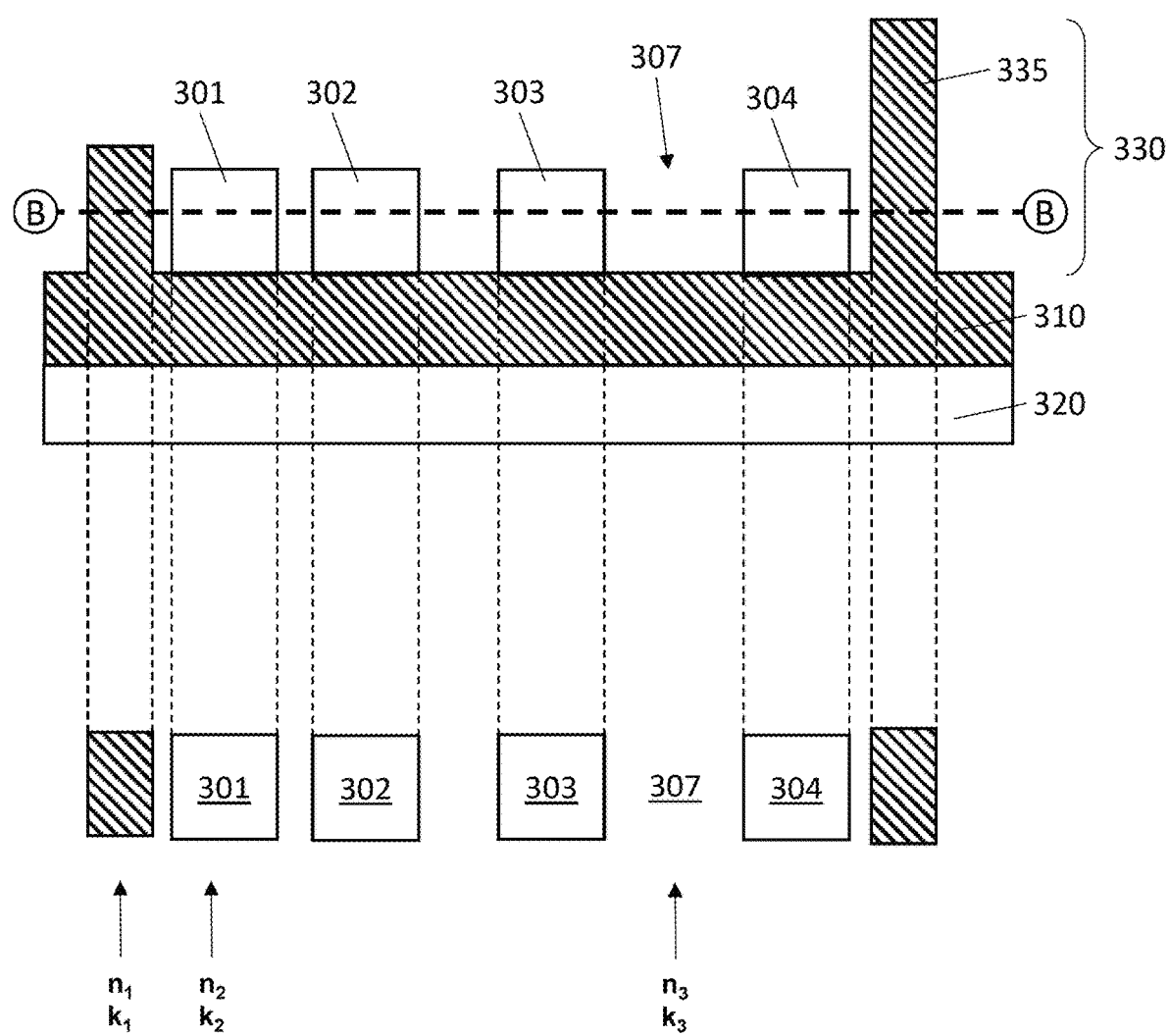
FIG. 3C shows an arrangement as disclosed herein which includes an outcoupling layer and a dielectric layer.
FIG. 3D shows areas of varying bulk refractive index of the arrangement shown in FIG. 3C.

The additional material 335 in the outcoupling layer may include one or more same materials as in the dielectric layer 310, in which case it may be described herein as being a part of the dielectric layer 310. For example, as shown in FIG. 3C, the dielectric layer 310 may extend into the outcoupling layer 330 to provide the additional material 335 in the outcoupling layer. This portion of the dielectric layer thus may provide one of the three or more regions of different bulk refractive index as previously disclosed. FIG. 3D shows a top-down view of the different regions of bulk refractive index and dielectric constant through the plane represented by the line B-B in FIG. 3C. The regions of different bulk index are aligned with the corresponding features in FIG. 3C. As in FIGS. 3A-3B, it can be seen that the plane represented by B-B passes through three regions within the outcoupling layer 330 that have different bulk indices of refraction.

Figure 3E:
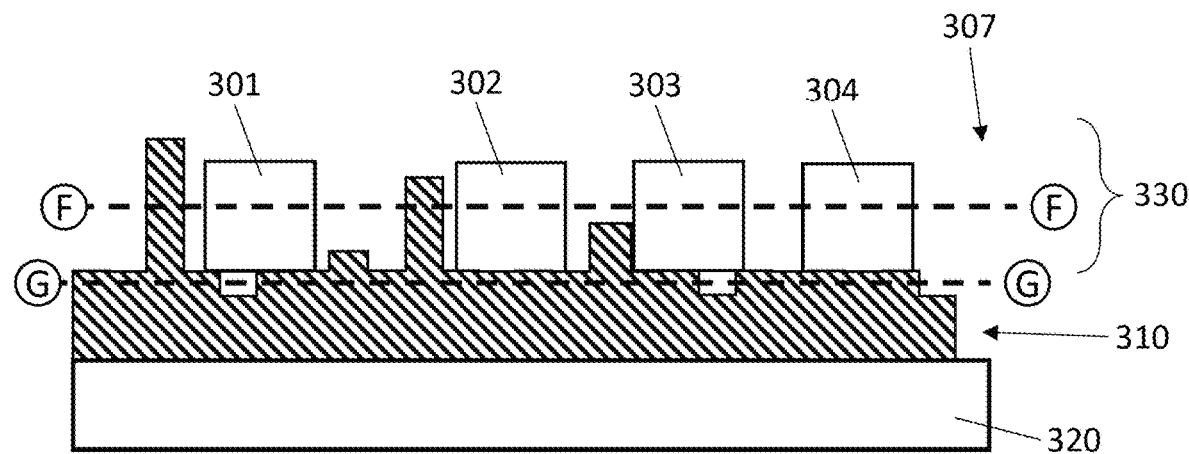
FIG. 3E shows an arrangement as disclosed herein which includes an outcoupling layer and a dielectric layer.
Figure 3F:
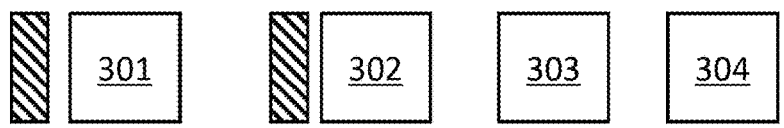
FIG. 3F and FIG. 3G show areas of varying bulk refractive index of the arrangement shown in FIG. 3E.
Figure 3G:

As suggested by the protrusion 335 in FIG. 3C, the dielectric layer itself may have in-plane variation in the refractive index. FIG. 3E shows the same general arrangement as FIGS. 3A-3D, in which the dielectric layer includes a uniform material (i.e., no sub-units as described below), but which still exhibits in-plane variation in the refractive index due to the height or thickness differences of the dielectric layer which enable the presence of air or another surrounding medium to vary the refractive index in-plane. FIG. 3F shows the areas of different bulk refractive index through a plane represented by line F-F and is aligned vertically with FIG. 3E. Similarly, FIG. 3G shows the variation in bulk refractive index through a plane represented by line G-G and is vertically aligned with FIG. 3E. In this example, the dielectric layer 310 shows areas having two different bulk refractive indices, while the outcoupling layer 330 shows areas with three different bulk refractive indices as previously disclosed. The presence or absence of nanoparticles, as well as their material (such as metal, semiconductor, insulator, or the like), may also affect the in-plane refractive index. Such a dielectric layer may be fabricated via spin coating, patterning of the dielectric layer either during deposition through techniques like shadow masking, or post deposition by techniques like photolithography, ion milling, ion etching or the like. Further changes to refractive index can be achieved by incorporating very small nanoparticles into the dielectric materials. For example, incorporation of $TiO_2$ nanoparticles into polymethyl methacrylate may introduce a varying refractive index within the plane of the metal nanoparticles. Size ranges of the dielectric layer nanoparticles may range from 2 nm to 500 nm, more preferably 5 nm to 100 nm.

Figure 3H:
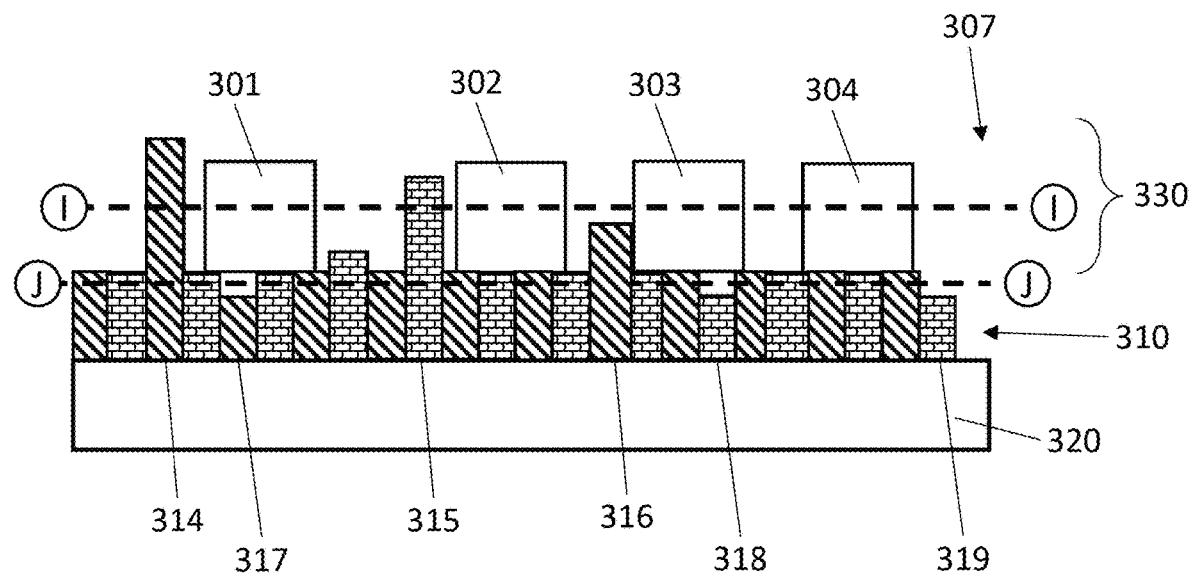
FIG. 3H shows an arrangement as disclosed herein which includes an outcoupling layer and a dielectric layer.
Figure 3I:
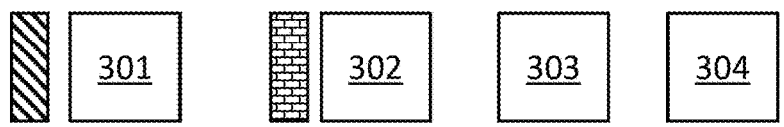
FIG. 3I and FIG. 3J show areas of varying bulk refractive index of the arrangement shown in FIG. 3H.
Figure 3J:
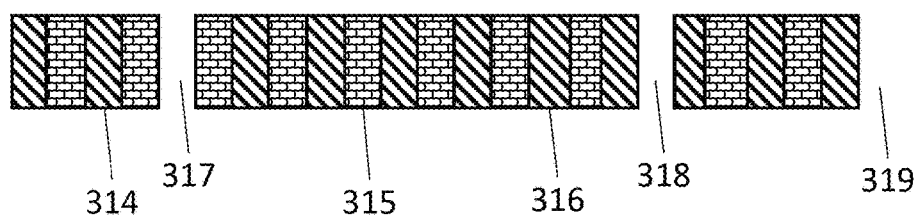

More generally, the dielectric layer may include multiple regions that may have different material properties, dimensions, compositions, or combinations thereof. For example, the different regions may have varying surface energy as measured by contact angle measurements, such as to facilitate a corresponding type of processing step during fabrication of the dielectric layer. The different regions of the dielectric layer may be referred to as sub-units. FIG. 3H shows the same arrangement as in FIG. 3E, where the dielectric 310 layer includes multiple sub-units instead of a uniform composition. FIGS. 3I and 3J show the regions of varying bulk refractive index as previously disclosed across planes corresponding to lines I-I and J-J, respectively. The sub-units may be oriented such that they vary in the plane of the dielectric layer or such that they vary along the vertical thickness of the dielectric layer. The sub-units may have distinct refractive indexes, for example because they are composed of multiple types of material such as dielectrics/insulators and metals and semiconductors, with various refractive index values. The thickness, or height, of the dielectric layer and the sub-units need not be uniform. Portions of the dielectric layer may be disposed below the bottom edge of the outcoupling layer and/or some or all of the dielectric layer may exactly touch the bottom edge of the outcoupling layer and/or some or all of the dielectric layer may extend above the bottom of the outcoupling layer by extending into the outcoupling layer as previously disclosed and/or some or all of the dielectric layer may extend above the top of the outcoupling layer. That is, the dielectric layer may exhibit any number of the following simultaneously: sitting below the bottom edge of the outcoupling layer, exactly touching the bottom edge of the outcoupling layer, extending above the bottom of the outcoupling layer, and/or extending above the top of the outcoupling layer.

One or more sub-units in the dielectric layer may act as adhesion layers for the nanoparticles. Alternatively or in addition, one or more sub-units in the dielectric layer may act as anti-stick layers to reduce the likelihood of nanoparticle adhesion. Further, the sub-units may act as adhesion or anti-stick layers to form nanoparticles atop the layers via various physical vapor deposition (PVD) methods including, but not limited to, thermal evaporation, electron beam evaporation, sputtering, cathodic arc deposition, close-space sublimation, pulsed laser deposition, pulsed electron deposition, sublimation sandwich method, or the like. As previously explained with respect to FIGS. 3C-3G, portions of the dielectric layer 310 may extend into the outcoupling layer 330. The sub-units may act as adhesion or anti-stick layers to form nanoparticles via a transfer processing methods including, but not limited to, cold fusion welding, PMMA donor transfer method, or the like. In the arrangement shown in FIG. 3H, one or more sub-units may extend into the outcoupling layer 330. For example, sub-units 314, 315, 316 extend upward into the outcoupling layer. Similarly, some sub-units may not extend entirely to the bottom plane of the outcoupling layer, such as sub-units 317, 318, 319.

Figure 3K:
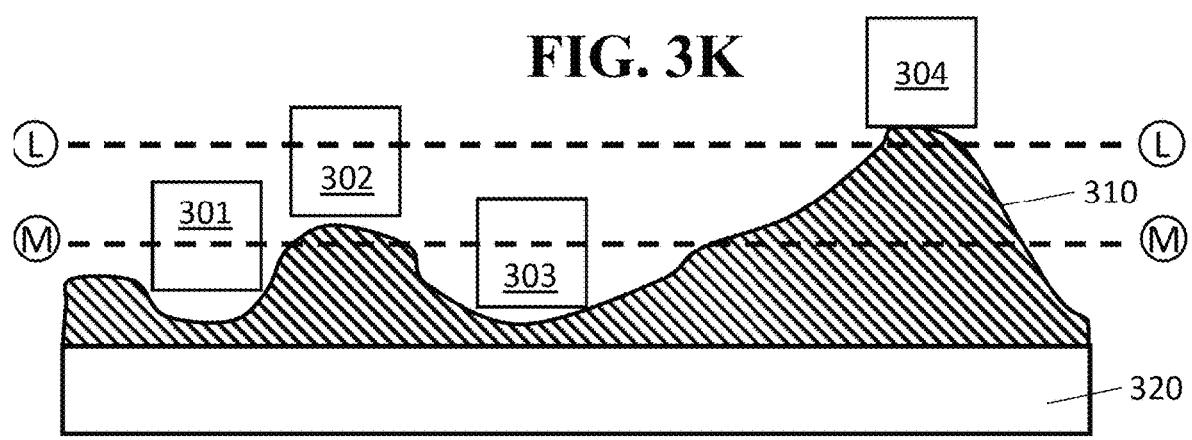
FIG. 3K shows an arrangement as disclosed herein which includes an outcoupling layer and a dielectric layer.
Figure 3L:
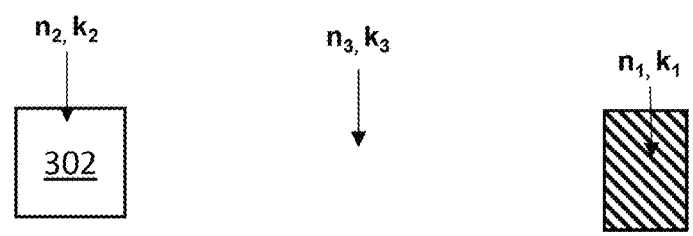
FIG. 3L and FIG. 3M show areas of varying bulk refractive index of the arrangement shown in FIG. 3K.
Figure 3M:
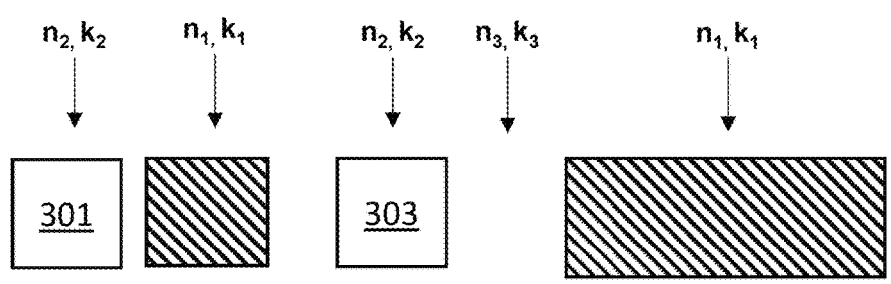

FIGS. 3A-3J show arrangements in which the dielectric layer is modeled as a planar layer or a region with rectangular sub-units. However, in practice the dielectric layer may have an irregular shape as shown in FIG. 3K. FIGS. 3L and 3M show the associated regions of varying refractive index associated with planes through lines L-L and M-M, respectively, in FIG. 3K. FIGS. 3L and 3M are vertically aligned with FIG. 3K to show the correspondence between these regions and the features in FIG. 3K. The dielectric layer may have other types of shape or cross-section. For example, it may have a gradient thickness in one or more directions across the device such that it is generally wedge-shaped, or the dielectric layer may have a periodic difference in thickness such as a filled grid or the like. As another example, the dielectric layer may take the shape of over-lapping solids, such as closely-packed semi-spheres, pyramids, rectangular solids (similar to the sub-units previously disclosed), or the like. It can also be seen that both planes L-L and M-M include at least three regions of different refractive indices as shown in FIGS. 3L and 3M. That is, an outcoupling layer as disclosed herein may encompass multiple planes that exhibit in-plane refractive index variation. In some cases, the planes having three regions of different indices may have some non-zero thickness, i.e., the region having in-plane refractive index variation may extend vertically within the stack.

The dielectric layer material may include, but is not limited to, organics (small molecule and/or polymer), oxides, fluorides, sulfides, nitrides, or other dielectric materials, including stacks, alloys, or mixtures of materials. A stacked dielectric layer may include, for example, two layers, one thicker, which acts as the primary dielectric layer material, and another thin layer that acts as a nanoparticle adhesion layer and may increase nanoparticle density and/or reduce nanoparticle aggregation or clumping as previously disclosed, particularly for colloidally processed nanoparticles. For example, polyelectrolyte layers (such as poly (styrenesulfonate) or poly(allylamine) hydrochloride) are known to carry an electrostatic charge that can interact with the electrostatic charge on a nanoparticle coating (for example, poly(vinylpyrrolidinone), which is commonly used to coat silver nanoparticles, carries a negative electrostatic charge). While the summation of the thicknesses of these layers determines the overall dielectric layer thickness, typical adhesion layer thicknesses are less than 5 nm, and dielectric layer thicknesses are between 1 to 100 nm, more preferably between 1 to 50 nm.

Structures as disclosed herein such as those shown in FIGS. 3A-3M may be incorporated in an emissive device such as an organic or inorganic diode or a hybrid device like an emissive quantum dot device which utilizes organic materials for charge transport, for example above the cathode or other electrode, such that the structure is disposed above an emissive layer, such as an organic emissive layer, or other layers of the emissive device.

Figure 4A:
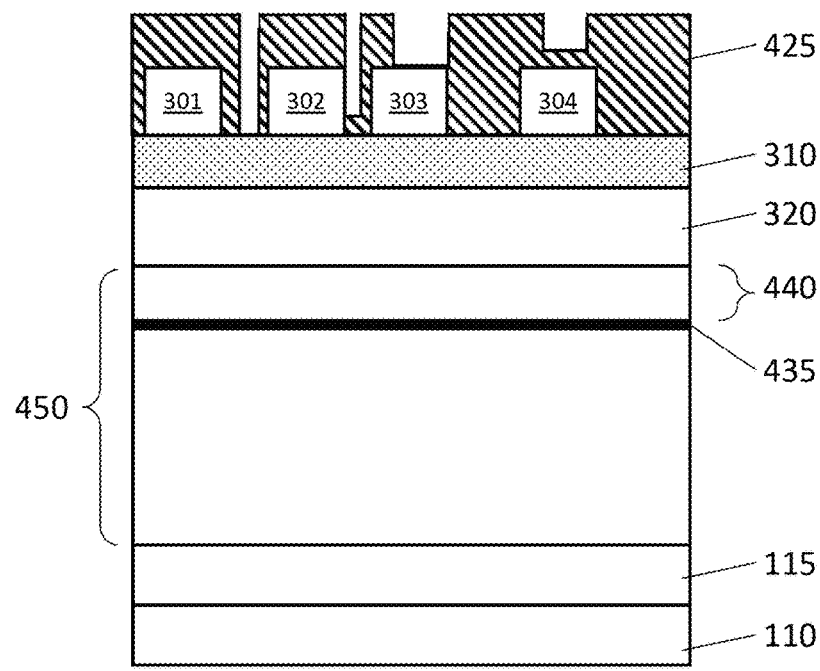
FIG. 4A shows the architecture of a device including an outcoupling layer and an enhancement layer according to embodiments disclosed herein.

For example, FIG. 4A shows a device architecture in which an emissive layer, such as an organic emissive layer used in OLEDs, lies at least partially within a threshold distance of the enhancement layer 320, which may be a metal cathode such as the cathode 160 shown in FIG. 1. The dielectric layer 310 is continuous and of uniform thickness to space the nanoparticles 301, 302, 303, 304 equidistant from the cathode 320. The nanoparticles in the outcoupling layer may be surrounded at least partially by another dielectric material 425, which may be a different or the same refractive index as the dielectric layer 310 and which may enable in-plane refractive index variation as previously disclosed. The dielectric layer 425 also may be portions of the dielectric layer 310 which extend into the outcoupling layer as previously disclosed. The emissive layer 435, which may be an organic emissive layer such the emissive layers 135, 220 described with respect to FIGS. 1-2, is disposed within a threshold distance 440 of the enhancement layer. The emissive layer may be any suitable combination of hosts, dopants, emissive materials, electrically-driven quantum dots and/or emissive quantum dot regions that use organic materials for charge transport, or any combination thereof. The device may further include an emissive stack 450 disposed between the enhancement layer/cathode 320 and an anode 115 disposed over a substrate 110, for example as disclosed with respect to FIGS. 1 and 2.

Figure 4B:
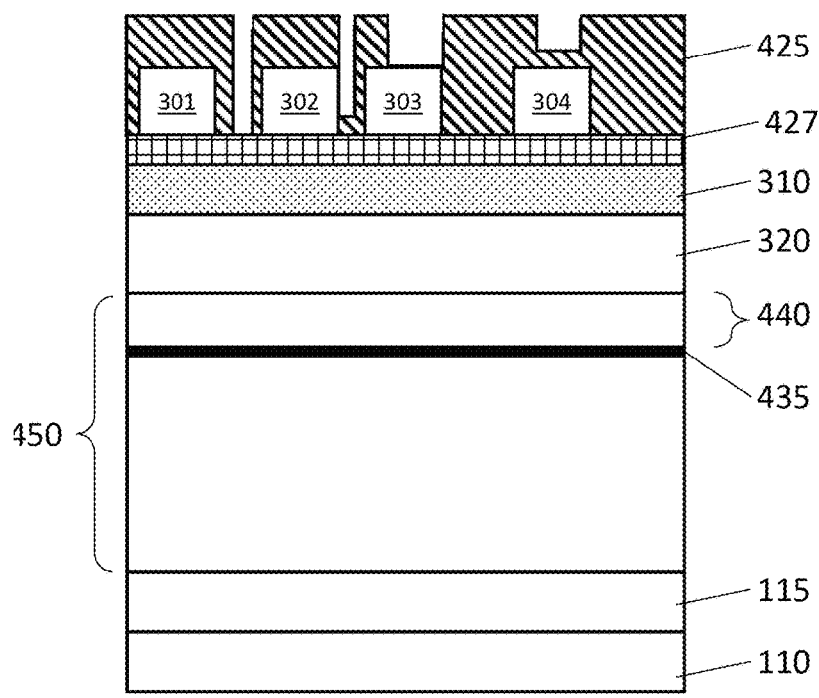
FIG. 4B shows the architecture of a device including an outcoupling layer and an enhancement layer according to embodiments disclosed herein.

FIG. 4B shows a similar device that includes an additional layer 425 that may be an adhesion layer for improving nanoparticle sticking deposited via either solution processed, transfer, or PVD methods, or may be an anti-stick layer to reduce the likelihood of nanoparticle adhesion deposited via either solution processed or PVD methods. The adhesion or anti-stick layer need not be uniform in thickness or continuous, and may also provide a portion of the in-plane refractive index variation in the outcoupling layer as previously disclosed, such as where the dielectric layer 310 is composed of multiple sub-units and/or is non-uniform. The adhesion or anti-stick layer 425 may be provided in addition to the thickness of the dielectric layer 310, or it may be some fraction of the thickness of the dielectric layer 310, for example from 0.01% to 99%, preferably 1% to 30%, and more preferably 1% to 10%.

Figure 5A:
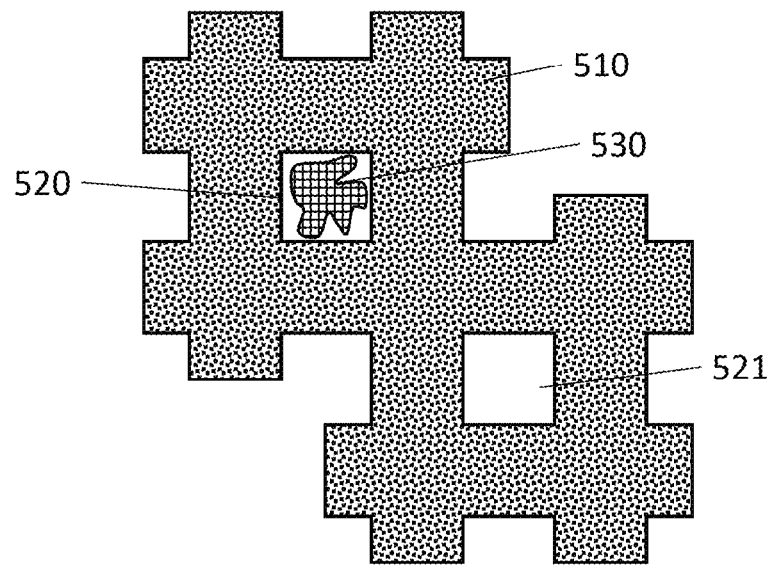
FIG. 5A shows a schematic representation of patterned nanoparticle deposition through use of an anti-stick material according to embodiments disclosed herein.
Figure 5B:
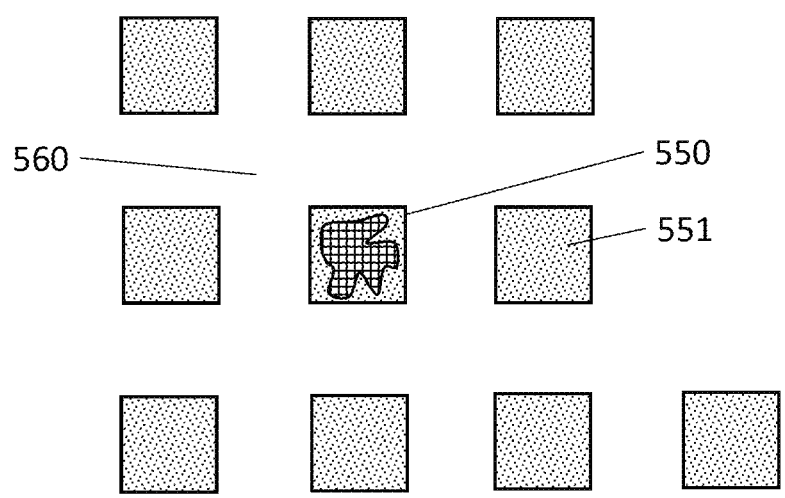
FIG. 5B shows a schematic representation of patterned nanoparticle deposition through use of an adhesion material according to embodiments disclosed herein.

FIG. 5A shows an arrangement of anti-stick material that may be used to achieve such morphologies. Patterned areas of anti-stick material 510, i.e., material with surface energies such that it is undesirable for the deposited material to wet the patterned anti-stick surface, may be deposited on a region where the outcoupling layer or other layer to incorporate nanoparticles is to be formed. This causes deposited material to clump to itself or aggregate or ripen on surfaces 520, 521 that are more favorable to wet, i.e., that do not include anti-stick material. This can result in patterned nanoparticle deposition. However, some areas such as 521 may be void of any metal, which may be intentional and may further add to the in-plane refractive index variation as previously disclosed. The deposited metal nanoparticles may form regular or irregular shapes 530. FIG. 5B shows a similar arrangement, but where the patterned layer is an adhesion layer instead of an anti-stick layer. In this example, material may preferentially be deposited on areas of adhesion material 550, 551, though some areas may be devoid of material such as 551, as previously disclosed. Material generally will not deposit on areas 560 lacking the adhesion layer. As previously noted, the deposited nanoparticles may be regular or irregular in shape. In both scenarios, the patterned adhesion layer or the negative space of the anti-stick layer may be arranged in a variety of layouts, including, but not limited to, periodic, quasi-periodic, or aperiodic (random) arrays. In some embodiments, the thickness of the adhesion layer or anti-stick layer may be 0.1 nm-300 nm, preferably, 1 nm-50 nm, more preferably 1 nm-10 nm.

Figure 6A:
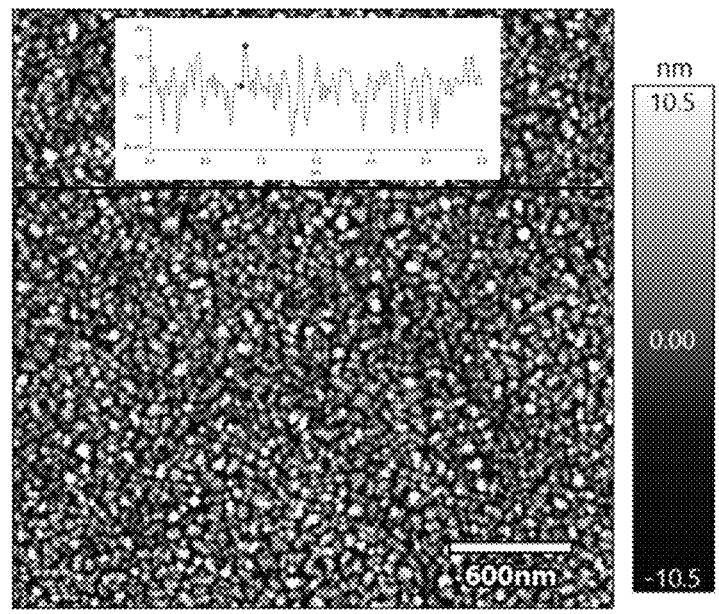
FIG. 6A and FIG. 6B show, respectively, atomic force microscope images of the surface roughness of a sample without a Ca anti-stick layer and with a glass/Ca/Ag adhesion layer as disclosed herein.
Figure 6B:
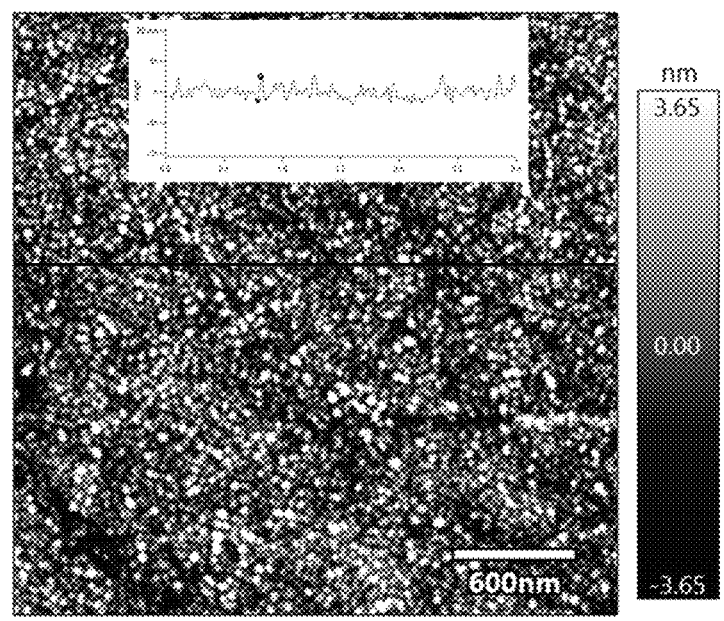

As a specific example, 10 nm of Ag may be thermally evaporated at 0.2 Å/s onto either a glass substrate or a glass substrate with an Ag adhesion layer of 1 nm-thick Ca. FIGS. 6A and 6B show atomic force microscope images of a glass/Ag sample and a glass/Ca/Ag sample, respectively. These images show that the surface roughness of the sample without the Ca layer (6A) is more than double that of the glass/Ca/Ag sample (6B). Similarly, the average size of the Ag particles is larger for the glass/Ag sample than the glass/Ca/Ag sample. This shows the ability of an adhesion or anti-stick layer to influence the in-plane refractive index variation by changing the Ag particle width and height. For example, the sample in FIG. 6A will have variable amounts of in-plane refractive index for up to ~30 nm. Even larger nanoparticles should be achievable by making the surface energy even more unfavorable for Ag, for example by depositing Ag on top of a self assembled monolayer, such as octadecyltrichlorosilane or others. The less preferable the substrate is for Ag wetting, the more likely the Ag will prefer to stick to itself (rather than wet the substrate) and the more likely it is for larger nanoparticles to be formed.

When the nanoparticles clump together, the resonance wavelength of outcoupling can increase. For example, large clumps of even UV-resonant particles achieve IR NPA resonances. Thus, taking clumping into account as a possibility, examples of preferred embodiments of LED materials and nanoparticle outcoupling material and size distributions may be selected as shown in Table 2.

TABLE 2

Non-limiting examples of potential enhancement layer and/or metal nanoparticle materials and particle size ranges assuming a dielectric layer between the enhancement layer and metal nano size material with a refractive index of 1.5 and allowing for nanoparticle clumping.

| $\lambda_{max}$ wavelength [nm] | Potential enhancement layer and/or metal nanoparticle materials | Particle size range |
|---|---|---|
| >760 | Ag, Au, ITO, Si, Ge, SiO2, Al, Rh, Pt | 5-250 nm |
| 610 to 760 | Ag, Au, SiO2, Al, Rh, Pt, Si, Ge | 5-200 nm |
| 590 to 610 | Ag, Au, SiO2, Al, Rh, Pt, Si, Ge | 5-150 nm |
| 570 to 590 | Ag, Au, SiO2, Al, Rh, Pt, Si, Ge | 5-100 nm |
| 500 to 570 | Ag, Al, Rh, Pt, SiO2, TiO2, Si, Ge | 5-125 nm |
| 450 to 500 | Ag, Al, Rh, Pt, TiO2 | 5-125 nm |
| 400 to 450 | Al, Rh, Pt, TiO2 | 5-100 nm |
| <400 | Al, Rh, Pt, TiO2 | 5-75 nm |
| White | Ag, Al, Rh, Pt, TiO2 | 5-125 nm |

The adhesion layer also may not be uniform in thickness. For example, it may be generally wedge-shaped as previously disclosed with respect to the dielectric layer. A non-uniform adhesion layer may provide another mechanism to achieve in-plane refractive index variation. For example, a plane may be identified that passes through the non-uniform adhesion layer as well as portions of the dielectric layer and/or the outcoupling layer, thereby providing various regions of different material type, composition, or the like, each having different refractive indices. A non-uniform-thickness adhesion or anti-stick layer may be separate from the dielectric layer as previously disclosed, or it may be some fraction of the thickness of the dielectric layer, for example from 0.01% to 99%, preferably 1% to 30%, and more preferably 1% to 10%.

Figure 10:
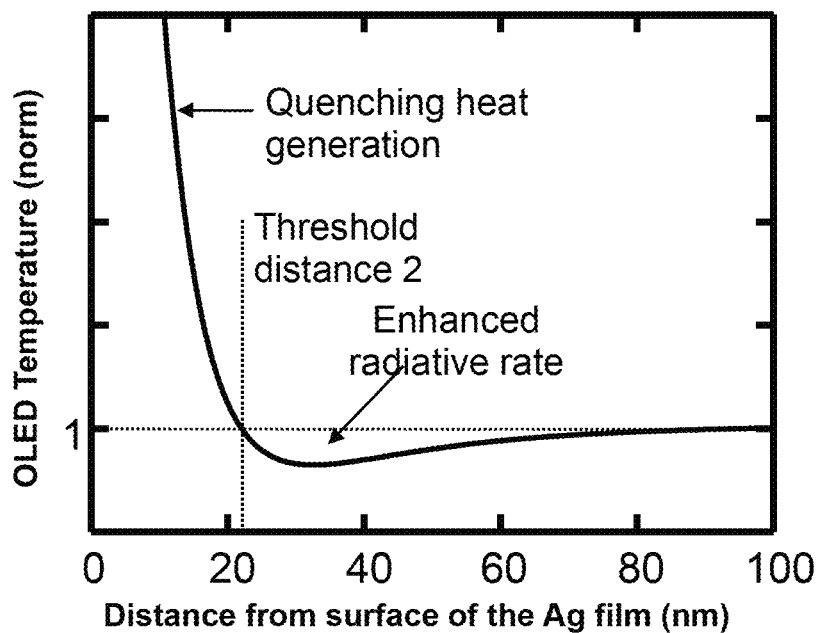
FIG. 10 shows the temperature of the OLED as a function of distance from the surface of the silver film for an embodiment of an emissive material in an OLED with an enhancement layer of a silver film plotted for the rate constants in FIGS. 7 and 8 as disclosed herein. In this embodiment no outcoupling structure is part of or near the enhancement layer so all non-radiative coupling is dissipated as heat which then increases the temperature of the OLED.

The enhancement layer may be a planar metal film and/or it may include metal nanoparticles and may be pure or an alloy or a mixture, preferably of Ag, Al, Ag—Al alloys, or Au, for example as described with respect to FIG. 10. The enhancement layer may be composed of other materials including, but are not limited to Ir, Pt, Ni, Cu, W, Ta, Fe, Cr, Mg, Ga, Rh, Ti, Ca, Ru, Pd, In, Bi. The nanoparticles, additionally, may consist entirely of dielectric materials, may be an alloy of metals, may be dielectric materials, or may have a core of one type of material and be coated with a shell of a different type of material. Typical nanoparticle sizes for scattering out light in the visible part of the spectrum range from 5 nm to 1000 nm, depending on the nanoparticle material and shape. If the OLED or LED is designed for emission in the near infrared or infrared the particle size may range from 500 nm to 5000 nm.

Table 1 shows example potential enhancement layer and/or metal nanoparticle materials and particle size ranges. The thicknesses of the dielectric layer may range from 0-150 nm, more preferably from 0-50 nm for visible emission and larger for the infrared spectrum. Note that in the special case where the dielectric layer thickness is 0 nm (i.e., no dielectric layer is present), the nanoparticles sit directly atop the planar metal and may serve as a form of corrugation to outcouple the surface plasmon energy. The refractive index of the dielectric layer can range from 1.01 to 5, depending on the material utilized.

TABLE 1

Non-limiting examples of potential enhancement layer and/or metal nanoparticle materials and particle size ranges and assuming a dielectric layer between the enhancement layer and metal nano size material with a refractive index of 1.5 and assuming monodisperse monolayer of nanoparticles. Particle sizes are assuming nanocubes, particles with variable length axis may have different ranges.

| $\lambda_{max}$ wavelength [nm] | Potential enhancement layer and/or metal nanoparticle materials | Particle size range |
|---|---|---|
| >760 | Ag, Au, ITO, Si, Ge | 100-250 nm |
| 610 to 760 | Ag, Au, SiO2, Si, Ge | 75-200 nm |
| 590 to 610 | Ag, Au, SiO2, Si, Ge | 60-150 nm |
| 570 to 590 | Ag, Au, SiO2, Si, Ge | 50-100 nm |
| 500 to 570 | Ag, Al, Rh, Pt, SiO2, Si, Ge, TiO2 | 40-125 nm |
| 450 to 500 | Ag, Al, Rh, Pt, TiO2 | 40-125 nm |
| 400 to 450 | Al, Rh, Pt, TiO2 | 50-100 nm |
| <400 | Al, Rh, Pt, TiO2 | 30-75 nm |
| White | Ag, Al, Rh, Pt, TiO2 | 40-125 nm |

The nanoparticles may be coated with an oxide layer, where a thickness of the oxide layer may be selected to tune a plasmonic resonance wavelength of the plurality of nanoparticles or a nanoparticle based outcoupling element. The nanoparticle based outcoupling element resonance may be tunable by at least one of varying a size of the plurality of nanoparticles, varying a shape of the plurality of nanoparticles, changing a material of the plurality of nanoparticles, adjusting a thickness of the material, changing the refractive index of the material layer, changing the refractive index of the material or an additional layer disposed on the plurality of nanoparticles, varying a thickness of the electrode layer, and/or varying the material of the first electrode layer. The plurality of nanoparticles may be formed from at least one of Ag particles, Al particles, Au particles, dielectric material, semiconductor materials, an alloy of metal, a mixture of dielectric materials, a stack of one or more materials, and/or a core of one type of material and that is coated with a shell of a different type of material. At least one of the plurality of nanoparticles of the device may include an additional layer to provide lateral conduction among the plurality of nanoparticles.

In some embodiments, the nanoparticles 301, 302, 303, 304 may be coated, for example with a ligand shell. As used herein, such nanoparticles are considered as having a single bulk refractive index, which may be determined experimentally or the effective average of the indices of the nanoparticle and coating materials may be used. As such, a plane passing through only coated nanoparticles and one other material would not be considered to include at least three regions having different bulk indices of refraction, because the coated nanoparticles are considered to have a single bulk index of refraction. This presumes, however, that the nanoparticles and coating are uniform, essentially uniform, or uniform to within a tolerance such that there is no difference or no more than de minimis difference in bulk refractive index between the two; if the outcoupling layer included nanoparticles of two different materials and/or two different coating materials, the two different types of nanoparticles may have different bulk indices of refraction and thus a plane passing through both types of nanoparticles and one other material would be considered to have at least three regions having different indices as disclosed herein.

Figure 16:
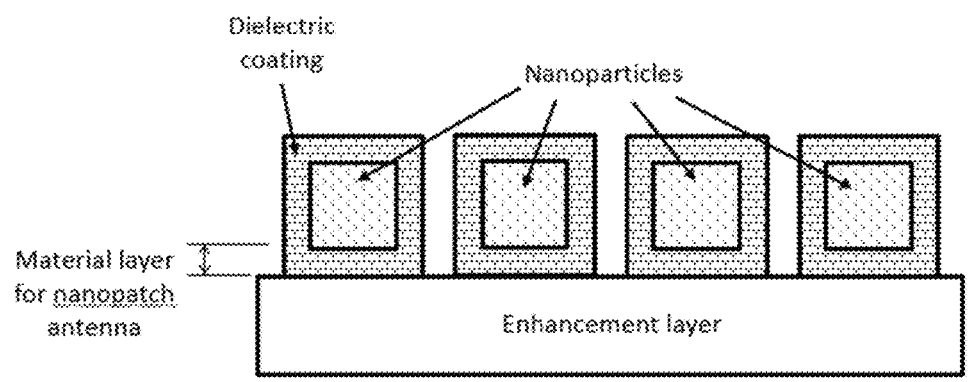
FIG. 16 shows an example of nanoparticle coating used to establish an appropriate dielectric layer thickness between the nanoparticle and the metal film as disclosed herein.

In some embodiments, the nanoparticles may be metallic and coated with a non-metallic coating and then placed on top of the enhancement layer directly, for example as shown in FIG. 16. In this embodiment the refractive index of the coating may be between 1.01 and 5. The thickness of the coating may be from 3 nm to 1000 nm, more preferably from 3 nm to 100 nm. The nanoparticle coating may serve as part, or all, of the dielectric spacing layer. This could entail coating the particles with the entire spacer thickness desired, thereby reducing the spacer layer thickness to zero, or some combination of spacer layer thickness plus nanoparticle coating to achieve the desired total spacer thickness. Further, the nanoparticle coating could act as an adhesion layer to improve nanoparticle adhesion to or increase nanoparticle density on the layers onto which they will be deposited. The nanoparticles made be composed of Ag, Al, Ag—Al alloys, Au, Au—Ag alloys, Au—Al alloys. The enhancement layer and/or nanoparticles may be composed of other materials including, but are not limited to Ir, Pt, Ni, Cu, W, Ta, Fe, Cr, Mg, Ga, Rh, Ti, Ca, Ru, Pd, In, Bi. In some cases, the metallic core can be composed of more than one material, such as an Ag sphere that is coated in Rh and then coated with a dielectric material like $SiO_2$ as shown in FIG. 16. The nanoparticle coating also may provide material to function as part of a nanoparticle based outcoupling element as disclosed herein.

Although shown schematically herein as square or other uniform simple shapes, more generally the nanoparticles in the outcoupling layer and/or one or more dielectric layers may be any shape, including non-uniform and/or non-homogeneous shapes. For example, the nanoparticles may cubes, spheres, spheroids, cylindrical, parallelpiped, rod-shaped, star-shaped, pyramidal, and/or multi-faceted three-dimensional objects. The use of a variety of different shapes may enable the outcoupling layer to more efficiently scatter light of multiple frequencies or colors all with the same layer. The nanoparticles may vary in size from 5 nm to 1000 nm. They also may vary in dimensions, for example having differences in the size of the longest axis of each nanoparticle. In some cases it may be desirable to have a variety of different sizes and shapes of nanoparticles within the outcoupling layer. The nanoparticle material may vary as well. For example, the nanoparticles may be made of metal, dielectric, and/or semiconductor materials, and each nanoparticle may itself contain subunits of different materials, including stacks and/or alloys of materials. However, as previously disclosed, any particular nanoparticle or type of nanoparticle composition is considered in the present disclosure to have only a single bulk refractive index for purposes of describing a layer having variation in the bulk refractive index within a plane extending through the layer. Nanoparticles also may be dispersed throughout the outcoupling layer, for example where they are embedded in another dielectric material which may be the same as or different from one or more materials in the dielectric layer.

Nanoparticles as described herein may be synthesized colloidally and deposited using solution processing methods, such as spin casting, drop casting, blade coating, air brushing, paint brushing, dip coating, Langmuir Blodgett, and the like. They may also be transfer to the substrate using printing methods or dry or we transfer techniques. Alternatively, PVD methods may be used to fabricate nanoparticles on a substrate for subsequent transferring to a device or fabricated directly onto the device itself. In either or both cases, it may be desired to arrange the nanoparticles into an ordered array, or some other non-random morphology, to enhance the plasmon outcoupling efficiency or tune the resonance.

The nanoparticles also may be deposited via inkjet printing, via a mechanism that involves touch like brushing, or by spraying the particles suspended in a solvent or aerosol.

Alternatively, the nanoparticles may be fabricated through a top-down approach which may include a lift-off process, a development process, a light-based lithography such as photolithography or laser interference lithography or zone plate lithography, an electron beam lithography process, and/or focused ion milling process. Other suitable techniques for depositing the nanoparticles include spin coating, doctor blading process, slot-die coating, bar coating or dip coating, or combinations thereof. Once the nanoparticles are deposited in some embodiments a drying process may be employed to remove any residual solvent, air or moisture from the deposition surface. Such drying methods include vacuum drying, nitrogen blow off, HEPA drying, drying in a convection oven, surface tension gradient drying, IPA vapor vacuum drying, and spin drying. The nanoparticles also may be deposited via physical vapor deposition (PVD) techniques. The most common PVD processes are sputtering and evaporation. Examples of PVD deposition methods suitable for use with embodiments disclosed herein include: cathodic arc deposition, in which a high-power electric arc discharged at the target (source) material ablates away some into highly ionized vapor to be deposited onto the substrate/deposition surface; electron-beam physical vapor deposition, in which the material to be deposited is heated to a high vapor pressure by electron bombardment in high vacuum and is transported by diffusion to be deposited by condensation on the (cooler) substrate/deposition surface; vapor thermal evaporation (VTE), in which the material to be deposited is heated to a high vapor pressure by electrical resistance heating in high vacuum; close-space sublimation, in which the material and substrate are placed close to one another and radiatively heated; pulsed laser deposition, in which a high-power laser ablates material from the target into a vapor for subsequent deposition; sputter deposition, in which a glow plasma discharge (usually localized around the "target" by a magnet) bombards the material sputtering some away as a vapor for subsequent deposition; pulsed electron deposition, in which a highly energetic pulsed electron beam ablates material from the target generating a plasma stream under nonequilibrium conditions; and sublimation sandwich methods, which may be used for creating man-made crystals.

One significant advantage of formation of the nanoparticles via physical vapor deposition is that there is no exposure of the OLED device to solvent. This means that any organic material can be utilized in the OLED structure regardless of its solubility is common solvents for colloidally synthesized particles. Further, there is no exposure of the OLED to solvent or solvent vapors that could damage the performance of the OLED.

PVD processes also may be combined with a masking process or lithography process in order to pattern or control the size, distribution and fill factor of the nanoparticles. The masking process may include deposition through a shadow mask, including porous membranes such as nanoporous aluminum oxide membranes, or fine metal mask. Alternatively, a prepatterned surface topography may be arranged on the deposition surface in order to facilitate the size, distribution and fill factor of the nanoparticles. To result in nanoparticles, the size of the features are preferably less than 10 micrometers, more preferably less than 3 micrometers, most preferably less than 1 micrometer. Lithography techniques may include ion or e-beam milling, deep UV lithography, area selective deposition, and deposition through nanoporous membranes, such as anodic alumina membranes. For depositions through membranes, it is preferred that the membrane opening be larger size of the nanoparticle which needs to be formed on top of the OLED. In some embodiments, the pore diameter is 1.1-1.5 times the maximum length or width (in plane dimensions) of nanoparticle to be formed. In other embodiments the pore diameter is over 2.0 times the maximum of the length or width of the nanoparticle to be formed.

Depending on the specific process used to form the nanoparticles, the deposition process may be carried out on a separate substrate and then transferred to the OLED or LED using any variety of transferring techniques, including but not limited to, cold press welding, use of donor and acceptor substrate with or without release layers, tape transfer, and laser induced thermal imaging. The use of a separate substrate and transfer method removes processing constraints that may not be amenable to the OLED or LED device. Example processing constraints include but are not limited to temperatures greater than 290K, solvent exposure, add or base exposure, laser ablation, ion milling, electron beam lithography, direct writing with an atomic force microscope tip, interference lithography, or reactive ion exposure. Alternatively, the dielectric layer between the enhancement layer and the deposited nanoparticle layer may be designed to act as a buffer layer to protect the OLED or LED from harsh processing. This may include thin film encapsulation layers, including, but not limited to, oxide layers, such as silicon dioxide, or aluminum oxide, and nitride layers, such as silicon nitride, sulfides, such as zinc sulfide. These buffer layers may be deposited via atomic layer deposition, chemical vapor deposition, sputtering, or e-beam, including multilayered buffer films utilizing a variety of deposition techniques. When using atomic layer deposition (ALD) the process may be assisted by either elevated temperature or use of a plasma or a combination of both. If elevated temperature is used, the temperature of the OLED preferably does not exceed the minimum glass transition temperature of the materials in the OLED stack plus 50K, more preferably does not exceed the minimum glass transition temperature of the materials in the OLED stack plus 0K.

In an embodiment where PVD of the nanoparticles occurs directly onto an OLED or LED without the protection of a buffer layer, processing temperatures should remain less than the lowest glass transition temperature material in the device if the material is a neat layer, or lower than the effective glass transition temperature if the material is doped into another material and, more preferably, substantially lower than these temperatures. This typically means processing temperatures of not more than 150 C, more preferably not more than 100 C in order to protect the device layers.

Figure 12A:
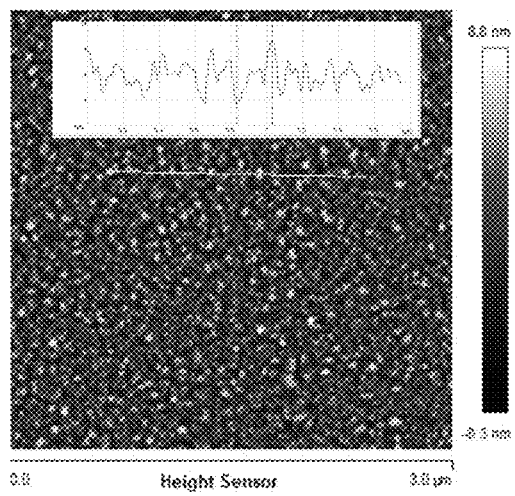
FIGS. 12A and 12B show the root-mean-square (RMS) roughness for Ag thermally evaporated onto a Si wafer at room temperature at a relatively slow deposition rate (FIG. 12A) and a faster deposition rate (FIG. 12B) as disclosed herein. A line cut is inset, showing roughly 50 nm diameter islands. The total Ag film thickness is 34 nm.
Figure 12B:
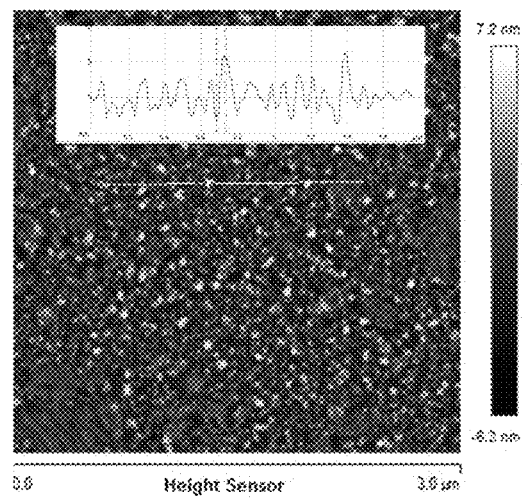

The nanoparticle fabrication may be achieved by means of island growth. In one embodiment, a self-assembled monolayer (SAM), such as fluoroalkylsilane, thiol based SAMs, carboxylic acid based SAMs, or others, may be used to induce de-wetting/islanding of certain metals, particularly Ag. Islanding will occur when the free energy of the substrate is less than the free energy of the metal combined with the free energy of the interface between the current and subsequent metal growth layers. In such a situation, it is most energetically favorable to form growth islands (nanoparticles) that maximize the exposed substrate area and minimize the exposed metal area. A SAM can be used to alter the substrate free energy, and hence induce island growth. This effect can be measured via changes to the contact angle of a droplet of de-ionized water. The contact angle is defined as the angle between the substrate surface and the contact surface of a droplet of water placed on the substrate, or any similar description known by one skilled in the art. The contact angle is determined by the energies at the solid-liquid, solid-gas, and liquid-gas interfaces. Therefore, modification of the surface energy via the presence of a SAM affects the contact angle. In some embodiments, to form islands, it is preferable to have a contact angle of greater than 45 degrees, more preferably greater than 70 degrees, and most preferably greater than 100 degrees. The deposition parameters may also be used to control island formation. For example, slow deposition rates of <1 Å/s, preferably <0.5 Å/s, and/or substrate temperatures of <170 K during deposition can promote island growth and metal nanoparticle formation. This can also be seen in the atomic force microscope images presented in FIGS. 12A-12B, where the root-mean-square (RMS) roughness increases for Ag thermally evaporated onto an Si wafer at room temperature at a slow deposition rate (0.05 Å/s, FIG. 12A) compared to a faster deposition rate (2 Å/s (FIG. 12B). The islands are roughly 50 nm in size for both deposition rates. In some embodiments, the temperature of the substrate is increased over room temperature such that increase metal atom mobility is achieved, enabling the nanoparticle formation which is thermodynamically preferred due to the surface energy set by the SAM.

Additionally, the angle of deposition may play a role in the formation of nanoparticles on the OLED rather than a continuous film. Here we define the off normal angle to be zero when the substrate plane is perpendicular to the deposition flux direction. If the flux were parallel to the substrate surface, the off normal direction would be 0 degrees. In some embodiments, the off normal angle should be more than 0 degrees, more preferably, the off normal angle is more than 15 degrees, most preferably the off normal angle is more than 45 degrees.

Figure 13A:
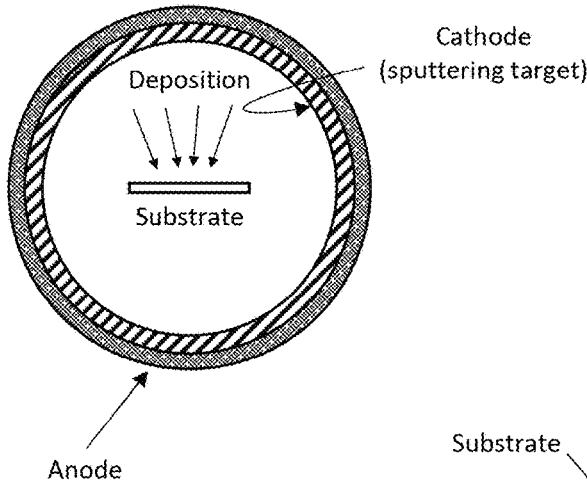
FIG. 13A and FIG. 13B show, respectively, schematic representations of a hollow cathode sputtering process and a facing target sputtering process suitable for use with embodiments disclosed herein.
Figure 13B:
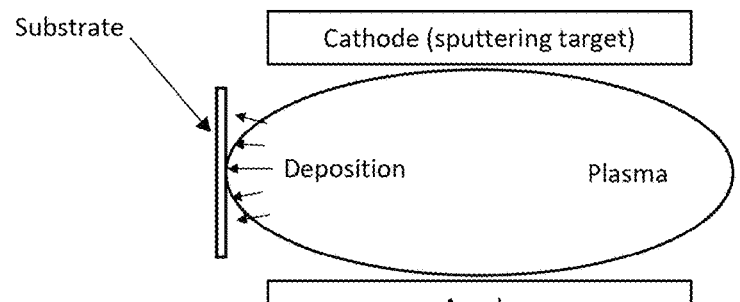

Certain PVD techniques, such as e-beam evaporation and sputtering, tend to aggressively deposit material, which can damage an OLED or LED. The tools can be engineered to reduce this effect. For example, sputtering produces high-energy particles that can impinge on the substrates and damage the OLED. Utilizing hollow cathode sputtering with an arrangement as shown in FIG. 13A where the sputter target has a section removed may reduce the damage to the OLED. In other embodiments, facing target sputtering in which the sputtering cathode and anode are in close proximity and the substrate is not in the ion pathway as shown in FIG. 13B may also lower any damage the substrate sustains. Similarly for electron beam deposition, in some embodiments the distance from the electron beam gun and metal source to the substrate is larger than twenty-four inches to reduce the secondary electron and x-ray damage, in other embodiments the distance is greater than thirty inches, in another embodiment it is greater than forty inches. In some embodiments, shielding will be installed around the electron beam source to limit the number of secondary electrons that impinge on the substrate. In other embodiments, rather than using sputtering or electron beam deposition, a metal will be deposited using an induction source to prevent any high energy electrons, x-rays, or ions from imparting damage to the substrate. In some embodiments the substrate will be cooled to prevent overheating. In some embodiments the cooling will be done with a liquid which can be water, ethanol led with dry ice, liquid nitrogen, or glycol.

Additionally, the substrate may be oriented to receive off-normal deposition flux in order to promote the growth of nanoparticles. While this effect is highly dependent on the surface energy of the substrate, off-normal deposition can help induce metal islanding. Moreover, as the heights of the islands increase, shadowing effects will start to appear for off-normal deposition. Thus, the shape of the nanoparticles, as well as their size and fill fraction, is highly dependent on the surface energy of the substrate and the growth conditions, but can be further tuned with off-normal deposition. Here we define the off normal angle to be zero when the substrate plane is perpendicular to the deposition flux direction. If the flux were parallel to the substrate surface, the off normal direction would be 0 degrees. In one embodiment, Ag is e-beam evaporated onto cleaned Si substrates and it is found that for off-normal angles of greater than 70 degrees between the substrate surface and deposition flux direction, nanoparticles will form when layer thicknesses are less than 500 nm, preferably less than 200 nm. Above a certain thickness threshold, the Ag islands will coalesce, and form elongated nanoparticle shapes. For cleaned, glass or Si substrates, and Ag evaporated via e-beam, this threshold occurs for layer thicknesses greater than 500 nm, preferably greater than 700 nm. Glancing angle deposition (meaning when the off normal angle is non zero) can also be used with nanosphere lithography to achieve nanoparticle formation in the interstitial areas between a monolayer of nanospheres. Again, the morphology of the nanoparticles is dependent on the deposition parameters and surface energy of the spheres and substrate. In one embodiment, Ag is e-beam evaporated onto a hexagonally close-packed polystyrene nanosphere monolayer (sphere sizes of 350-1000 nm) atop an Si substrate and it is found that, at a deposition angle of 55 degrees, nanoparticles form for Ag thicknesses less than 60 nm.

As previously disclosed, embodiments may use an enhancement layer disposed within the device architecture of an organic light emitting diode (OLED). For example, the enhancement layer described with respect to FIGS. 3A-3M may be disposed within such a device. The placement of the light-emitting material in the vicinity of an enhancement layer, which can include metallic materials or other plasmonically-active materials, increases interactions with the surface plasmon polariton at the enhancement layer dielectric interface. The device is designed such that the non-radiative modes of the enhancement layer quench the light emitter. Light is subsequently created in free space by scattering the energy from the plasmonic modes of the enhancement layer through the use of an outcoupling layer. The enhancement layer non-radiatively couples to fluorescent, delayed-fluorescent, radical emitters, and phosphorescent light emitting materials but may be especially useful for phosphorescent light emitters due to their small radiative decay rate constant. Rapid de-excitation of the light emitting material via resonant energy transfer to the enhancement layer surface plasmon polariton is expected to increase the stability of the OLED.

An example embodiment uses a thin film of silver (Ag) as an enhancement layer. This thin film of silver has a surface plasmon mode. For simplicity, the example may be considered in the context of a single emitting material, but in various embodiments the "emissive material" may include multiple emitting materials, layers of materials which are doped at high volume fractions of emissive material, neat layers of emissive material, an emissive material doped into a host, an emissive layer that has multiple emitting materials, an emissive layer in which the emission originates from a state formed between two materials, such as an exciplex or an excimer, or combinations thereof. The emissive material may be an organic emissive material or, more generally, any emissive layer structure known in the OLED field.

In an OLED, an important aspect of the emissive material is the photon yield, which also may be referred to as the photo luminescent quantum yield (PLQY). The photon yield may be defined as:

$$\text{Photon yield} = \frac{k_{rad}^{total}}{k_{rad}^{total} + k_{non-rad}^{total}} \quad (1)$$

where $k_{rad}^{total}$ is the sum of all the radiative processes and $k_{non-rad}^{total}$ rad is the sum of all the non-radiative processes. For an isolated emitter in vacuum, the molecular radiative and non-radiative rates, $k^0_{rad}$ and $k^0_{non-rad}{}^{total}$ are defined as the only radiative and non-radiative processes. For the isolated molecule, the yield of photons is then $$\text{Photon yield}^0 = \frac{k_{rad}^0}{k_{rad}^0 + k_{non-rad}^0} \quad (2)$$

Upon bringing an emissive material in proximity to the silver film, both the radiative and non-radiative rates may be modified as they are strongly dependent on the distance of the emitter from the interface between the metal and the dielectric medium in which the emitter sits. Equation (1) may be re-cast into equation (3) by adding the terms of $k_{rad}^{plasmon}$ and $k_{non-rad}^{plasmon}$, where $k_{rad}^{plasmon}$ is the radiative rate due to the presence of the Ag film and $k_{non-rad}^{plasmon}$ is the non-radiative rate due to the presence of the Ag film:

$$\text{Photon yield} = \frac{k_{rad}^{total}}{k_{rad}^{total} + k_{non-rad}^{total}} = \frac{k_{rad}^0 + k_{rad}^{plasmon}}{k_{rad}^0 + k_{rad}^{plasmon} + k_{non-rad}^0 + k_{non-rad}^{plasmon}} \quad (3)$$

Figure 7:
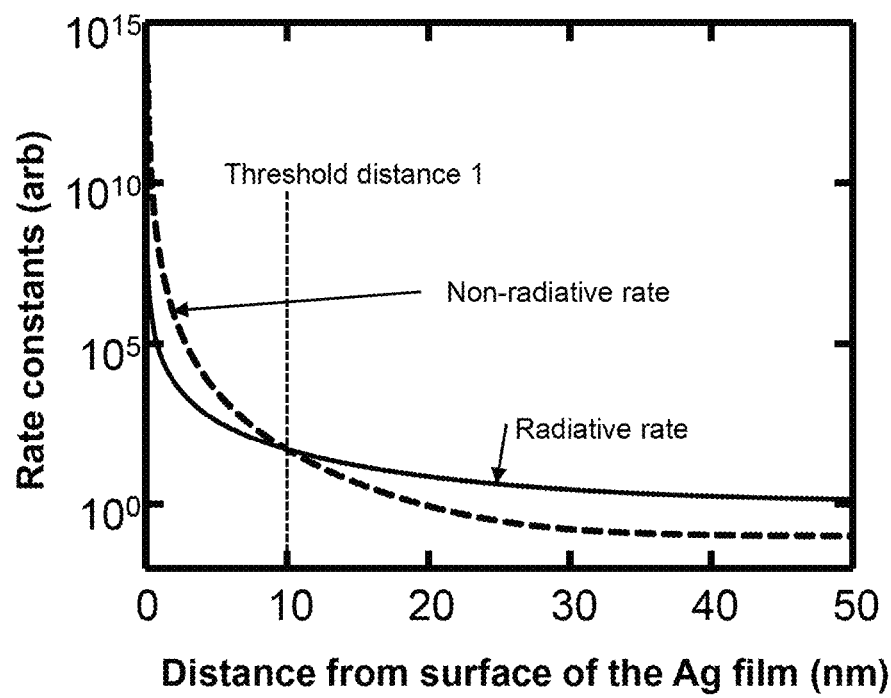
FIG. 7 shows a depiction of the rate constants versus distance from the surface of the silver film for an embodiment of an emissive material in an OLED with an enhancement layer of a silver film as disclosed herein. The distance is the distance from the metallic film surface closest to the emissive layer to the emissive material. A dashed line marks the distance at which the radiative rate is equal to the non-radiative rate and is threshold distance 1 as defined herein.

This is shown in FIG. 7, which schematically depicts the total radiative and non-radiative rates for an emitter as a function of distance from the surface of the Ag film. The distance is the distance from the metallic film surface closest to the emissive layer to the emissive material. A dashed line marks the distance at which the radiative rate is equal to the non-radiative rate and is a threshold distance. At this threshold distance the photon yield is 50%. Further, this basic breakdown of rates shows why in typical OLED devices the emissive layer is positioned a large distance away from any plasmonically-active material. If the emissive layer is too close to the metal layer, the energy is coupled non-radiatively into the plasmon modes of the contact(s) and there is a reduction in the efficiency of the device. In embodiments that make use of an enhancement layer as disclosed herein, the energy that would otherwise be lost in the non-radiative mode of the thin Ag film is extracted as photons outside the device utilizing an outcoupling layer as previously disclosed. Thus, the energy coupled to the surface plasmon mode of the enhancement layer may be recovered and it is beneficial, instead of deleterious, to enhance the amount of non-radiative coupling to the surface plasmon mode of the Ag film.

Figure 8:
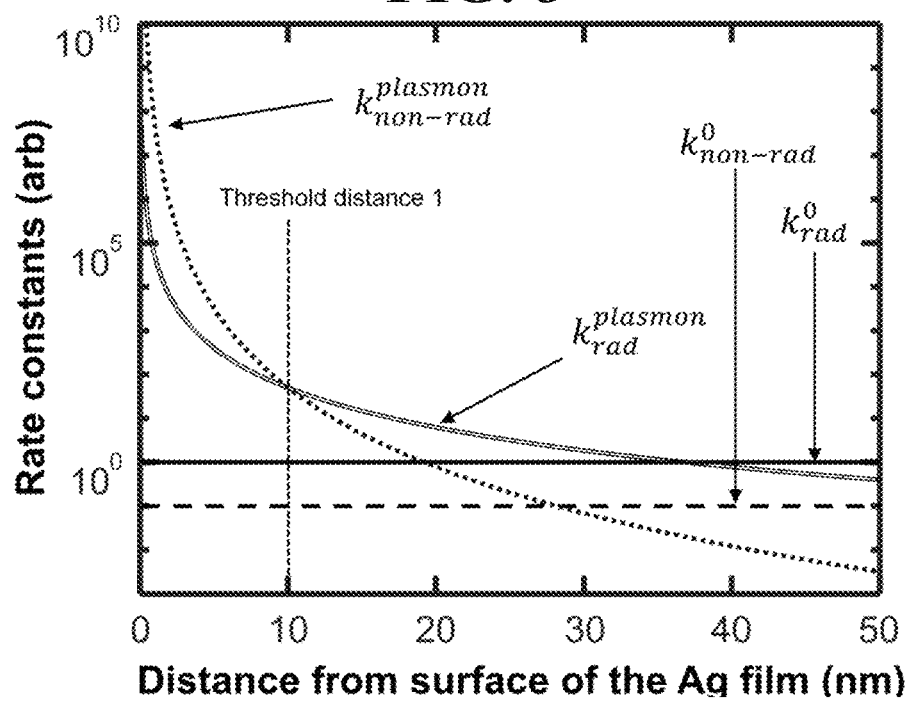
FIG. 8 shows rate constants versus distance from the surface of the silver film for an embodiment of an emissive material in an OLED with an enhancement layer of a silver film where the rate constants are broken out into example components as demonstrated in equation 3 as disclosed herein. The distance is the distance from the metallic film surface closest to the emissive layer to the emissive material.

To understand how to maximize the efficiency of the enhancement layer devices in this invention, some assumptions may be made about the relative dependence on distance for the plasmon radiative and non-radiative rates and break down the rate constants from FIG. 7 into the component rates as shown in FIG. 8 and described in equation 3. FIG. 8 shows the emitter's intrinsic radiative rate (solid line) as well as the radiative rate constant due to the emitter's proximity to the Ag thin film, which is $k_{rad}^{plasmon}$ in equation 3 (double line). The emitter's intrinsic radiative decay rate is not dependent on the distance from the Ag film, d. However, $k_{rad}^{plasmon}$ dependent on the distance from the Ag film, where here it is assumed to have a $1/d^3$ dependence. This is an illustrative example only and the actual dependence on distance can be a more complicated function, for example, when d is less than 7 nm or when d is on the order of the wavelength of emission divided by two times the index of refraction. Like the radiative rate, the non-radiative rate in vacuum of the emitter is not a function of distance from the Ag film. However, the non-radiative rate due to the presence of the Ag film, $k_{non-rad}^{plasmon}$, is dependent on the distance from the Ag film and has a stronger dependence on distance than $k_{rad}^{plasmon}$, namely, $1/d^6$.

Figure 9:
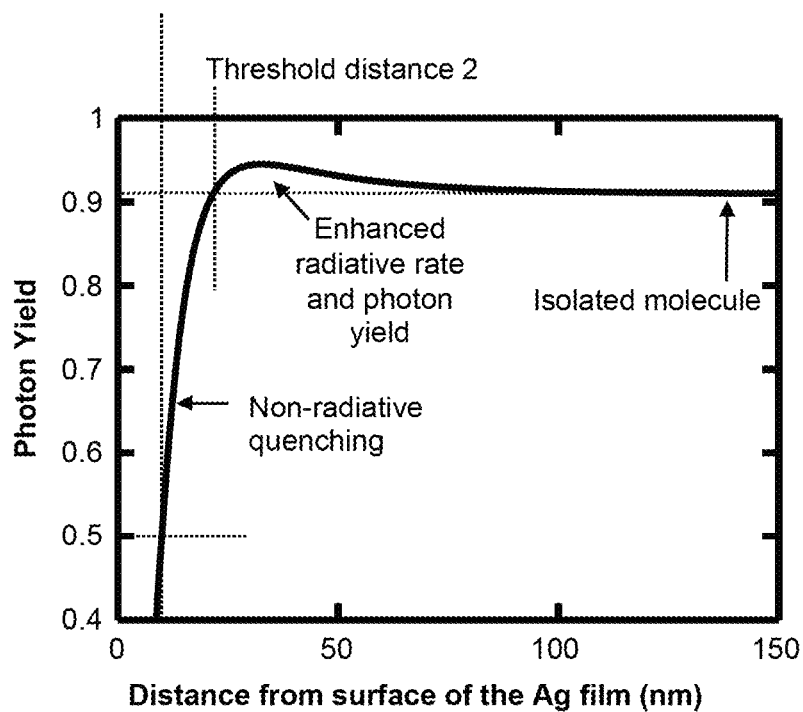
FIG. 9 shows photon yield versus distance from the surface of the silver film for an embodiment of an emissive material in an OLED with an enhancement layer of a silver film plotted for the rate constants in FIGS. 7 and 8 as disclosed herein. In this embodiment no outcoupling structure is part of or near the enhancement layer so all non-radiative coupling is dissipated as heat.

The different dependencies on distance from the metallic film results in a range of distances over which the radiative rate constant due to interaction with the surface plasmon is the largest rate constant. For these distances the photon yield is increased over the photon yield of an isolated molecule far from the metallic surface as shown in FIG. 9. At these distances there is also a speed-up in the emission rate for the light emitting material. As d is reduced from this point, the emitter is quenched into the non-radiative modes to the surface plasmon mode of the Ag film, and the yield of photons decreases below the limit of the isolated molecule. The point at which yield is reduced due to quenching to the surface plasmon mode is threshold distance 2. This is the minimum distance at which the photon yield is the same as the emitter without the enhancement layer. At distances below this threshold distance, there is an even larger speed up in the rate at which energy leaves the light emitter as the non-radiative rate exceeds the radiative rate for these distances. Importantly, in FIG. 9, it is clear that excitons are the source of energy transferred to the enhancement layer as the photon yield is lowered by moving the emission layer closer to the Ag thin film. Obtaining a curve similar in shape to FIG. 9 clearly indicates that excitons in the OLED are the species being quenching by the addition of the enhancement layer. Further, FIG. 10 is only one embodiment of the shape of the curve. In some cases where the distance dependence of $k_{non-rad}^{plasmon}$ is more similar to $k_{rad}^{plasmon}$ there may only be a continuous drop in the photon yield as d is reduced.

Using the rate constants from above, the threshold distance 2 may be defined as the distance at which the following inequality is satisfied:

$$\frac{k_{rad}^0 + k_{rad}^{plasmon}}{k_{rad}^0 + k_{rad}^{plasmon} + k_{rad}^0 + k_{non-rad}^0} \leq \frac{k_{rad}^0}{k_{rad}^0 + k_{non-rad}^0} \quad (4a)$$

$$k_{non-rad}^{plasmon} \geq \frac{k_{non-rad}^0}{k_{rad}^0} k_{rad}^{plasmon} \quad (4)$$

Plainly, equation 4a is the condition in which the PLQY when the enhancement layer is present is less than or equal to the photon yield without the enhancement layer. One knowledgeable in the art would not recommend operating when the photon yield is reduced as that typically reduces device efficiency. Equation 4 solves equation 4a for $k_{non-rad}^{plasmon}$ relative to the other rate constants. We can re-cast equation 4 explicitly utilizing the distance dependence of the plasmon rates as equation 5:

$$k_{non-rad}^{plasmon}(d) \geq \frac{k_{non-rad}^0}{k_{rad}^0} k_{rad}^{plasmon}(d) \quad (5)$$

Where d is the distance of the emitter from the surface of metallic film closest to the emitter.

Further, a threshold distance 1 is defined as the distance at which the emitter's photon yield is reduced to 50%. This threshold distance is the distance at which the total of the non-radiative rates from the emitter is equal to the total of the radiative rates of the emitter. Or plainly, the radiative rate of the emitter is equal to the non-radiative rate. Using the distance-dependent plasmonic rates and equation 3, we derive that the threshold distance 1 is when:

$$k_{non-rad}^{plasmon}(d) + k_{non-rad}^0 = k_{rad}^0 + k_{rad}^{plasmon}(d) \quad (6)$$

To determine threshold distance 1, if the enhancement layer does not radiate light, then one can simply grow an OLED, or comparable thin film representative examples, with the light-emitting material variable distances from the enhancement layer and determine at which distance the PLQY drops to 50%. If the enhancement layer has elements which enable outcoupling of light from the surface plasmon mode, these elements need to be removed to determine the threshold distance. It is important not to measure the relative increase or decrease in light output but the actual PLQY as the emission radiation pattern and absorption of the emitter can vary as the position of the emitter relative to the thin film of Ag is changed.

To determine threshold distance 2 as described by equation 4, one should measure the temperature of the OLED. Since non-radiative quenching of the exciton generates heat instead of photons, the OLED will heat up. Very simply, the heat generated in the OLED will be proportional to the yield of non-radiatively recombined excitons:

$$\text{Heat yield} \propto \frac{k_{non-rad}^{total}}{k_{rad}^{total} + k_{non-rad}^{total}} \quad (5)$$

As the distance between the light emitter and the metallic film is varied, the total heat conduction of the OLED will remain essentially constant, however, the heat yield will vary greatly.

FIG. 10 shows the steady state temperature of the OLED as the distance between the light emitter and metallic film is varied for a fixed current density of operation. For large distances of the emitting layer from the metallic surface there is no enhancement of the radiation or non-radiative quenching. The temperature of the OLED depends only on the total current density of operation and the efficiency of the light emitting material. As the emitter is brought closer to the metallic layer, the radiative rate increases and the photon yield is increases, reducing the heat generated in the OLED and the OLED's temperature. For distances shorter than threshold distance 2, the excitons on the light emitter are quenched as heat and the OLED's normalized temperature increases. This depiction of the temperature of the OLED is true when the enhancement layer is not outcoupling a predetermined significant fraction of energy in the surface plasmon mode as light. If there is outcoupling as part of the enhancement layer or an outcoupling layer is used in the device, such a layer is to be removed to perform this measurement of the threshold distance.

Two tests may be used to determine if the light emitter is positioned where the radiative or non-radiative surface plasmon rate constant is dominant using temperature. The first is to measure the temperature of the OLED devices with variable distance of the light emitting material from the metallic film, thereby replicating the schematic curve in FIG. 10. The second is to replace the metallic film in the device structure with a transparent conducting oxide that does not have a strong surface plasmon resonance. An example material is indium tin oxide (ITO). Measuring the temperature of the device with the ITO and with the metallic film, if the temperature of the OLED with the metallic film is increased over the ITO control then the non-radiative rate is dominant and the emitter is within threshold distance 2 of the enhancement layer.

Non-radiative energy transfer to the plasmon mode here is defined as the process in which the exciton is transferred from the light-emitting material to the surface plasmon polariton (SPP), localized surface plasmon polariton (LSPP), or other terminology those versed in the art would understand as a plasmon, without emitting a photon. Depending on the dimensionality of the metallic film or the metallic nanoparticles this process can be called Forster energy transfer, Forster resonant energy transfer, surface resonant energy transfer, resonant energy transfer, non-radiative energy transfer, or other terminology common to those versed in the art. These terms describe the same fundamental process. For weakly emissive states, energy transfer to the SPP or LSPP may also occur through Dexter energy transfer, which involves the simultaneous exchange of two electrons. It may also occur as a two-step process of single electron transfer events. Non-radiative energy transfer is broadband, meaning that in some embodiments the enhancement layer is not tuned for a particular light emitting material.

Embodiments disclosed herein do not utilize the radiative rate enhancement of the surface plasmon polariton, but rather the non-radiative rate enhancement. This is contrary to the conventional teaching in the art of OLEDs and plasmonics, which teaches against energy transfer to the non-radiative mode of the surface plasmon polariton as that energy is typically lost as heat. In contrast, embodiments disclosed herein may intentionally put as much energy as possible into the non-radiative mode and then extract that energy to free space as light using an outcoupling layer before that energy is lost as heat. This is a novel idea because it is a unique two-step process and goes against what those knowledgeable in the art would teach about the non-radiative modes of a surface plasmon polariton.

Figure 11:
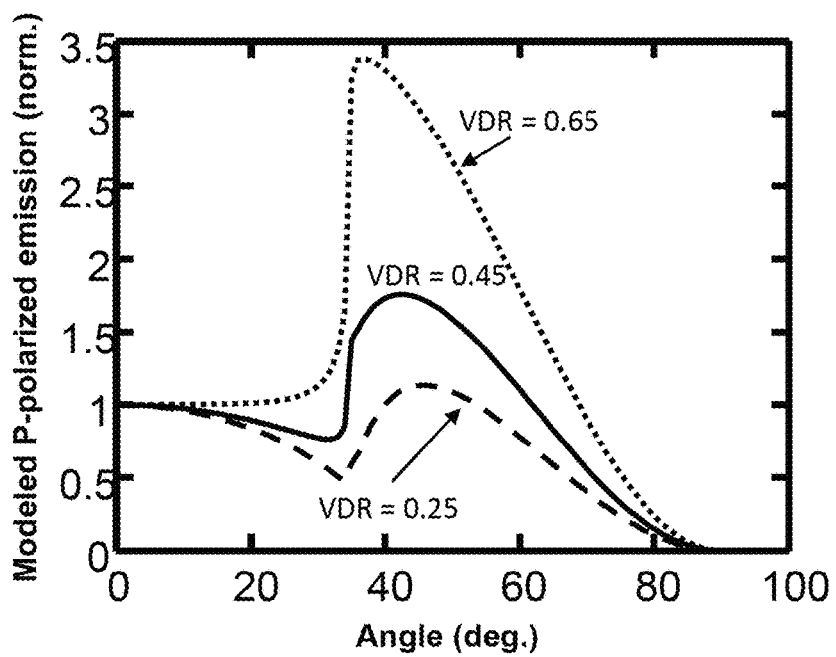
FIG. 11 shows modeled P-polarized photoluminescence as a function of angle for different VDR emitters as disclosed herein. In this example, there is a 30 nm thick film of material with index of 1.75 and the emission is monitored in a semi-infinite medium of index of 1.75. Each curve is normalized to a photoluminescence intensity of 1 at an angle of zero degrees, which is perpendicular to the surface of the film. As the VDR of the emitter is varied, the peak around 45 degrees increases greatly. When using software to fit the VDR of experimental data, the modeled VDR would be varied until the difference between the modeled data and the experimental data was minimized.

The vertical dipole ratio (VDR) is the ensemble averaged fraction of dipoles that are oriented vertically. A similar concept is horizontal dipole ratio (HDR) is the ensemble average fraction of dipoles oriented horizontally. By definition, VDR+HDR=1. VDR can be measured by angle dependent, polarization dependent, photoluminescence measurements. By comparing the measured emission pattern of a photoexcited thin film sample, as a function of polarization, to the computationally modeled pattern, one can determine VDR of the emission layer. For example, in FIG. 11, the modelled p-polarized angle PL is plotted for emitters with different VDRs. There is a peak in the data around 45 degrees with that peak in the data being larger when the VDR of the emitter is higher, as shown in the modeled data of p-polarized emission in FIG. 11.

Importantly, the VDR represents the average dipole orientation of the light-emitting species. Thus, if there are additional emitters in the emissive layer that are not contributing to the emission, the VDR measurement does not report or reflect their VDR. Further, by inclusion of a host that interacts with the emitter, the VDR of a given emitter can be modified, resulting in the measured VDR for the layer that is different from that of the emitter in a different host. Further, in some embodiments, exciplex or excimers are desirable which form emissive states between two neighboring molecules. These emissive states may have a VDR that is different than that if only one of the components of the exciplex or excimer were emitting.

The HOMO energy is estimated from the first oxidation potential derived from cyclic voltammetry. The LUMO energy is estimated from the first reduction potential derived from cyclic voltammetry. The triplet energy T1 of the emitter compounds is measured using the peak wavelength from the photoluminescence at 77K. Solution cyclic voltammetry and differential pulsed voltammetry were performed using a CH Instruments model 6201B potentiostat using anhydrous dimethylformamide solvent and tetrabutylammonium hexafluorophosphate as the supporting electrolyte. Glassy carbon, and platinum and silver wires were used as the working, counter and reference electrodes, respectively. Electrochemical potentials were referenced to an internal ferrocene-ferroconium redox couple (Fc+/Fc) by measuring the peak potential differences from differential pulsed voltammetry. The $E_{HOMO}=-[(E_{ox1}$ vs Fc+/Fc)+4.8], and the $E_{LUMO}=-[(E_{red1}$ vs Fc+/Fc)+4.8], where $E_{ox1}$ is the first oxidation potential and the $E_{red1}$ is the first reduction potential.

In some embodiments, a device as disclosed herein may include an additional layer disposed over the nanoparticles and may be disposed directly over and in direct physical contact with at least some of the nanoparticles. The additional layer may include one or more emitter molecules. The additional layer may match a refractive index beneath the first electrode layer. The additional layer has a thickness of 1000 nm or less.

In some embodiments the LED stack, the enhancement layer, and/or the nanoparticles may be encapsulated. Such encapsulation materials include oxide coatings and epoxies e.g. polyurethane, silicone, and the like, and may be deposited by atomic layer deposition or chemical vapor deposition In some embodiments, a white OLED or LED may utilize a nanoparticle outcoupling scheme of a specific resonance to selectively outcouple a certain wavelength range. In this way, a white OLED or LED can be fabricated over a large area and the resonance of the nanoparticle outcoupling scheme (via choosing nanoparticle size, refractive index, etc.) may be utilized to create red, green, blue (or any other desired color) subpixels.

Figure 14:
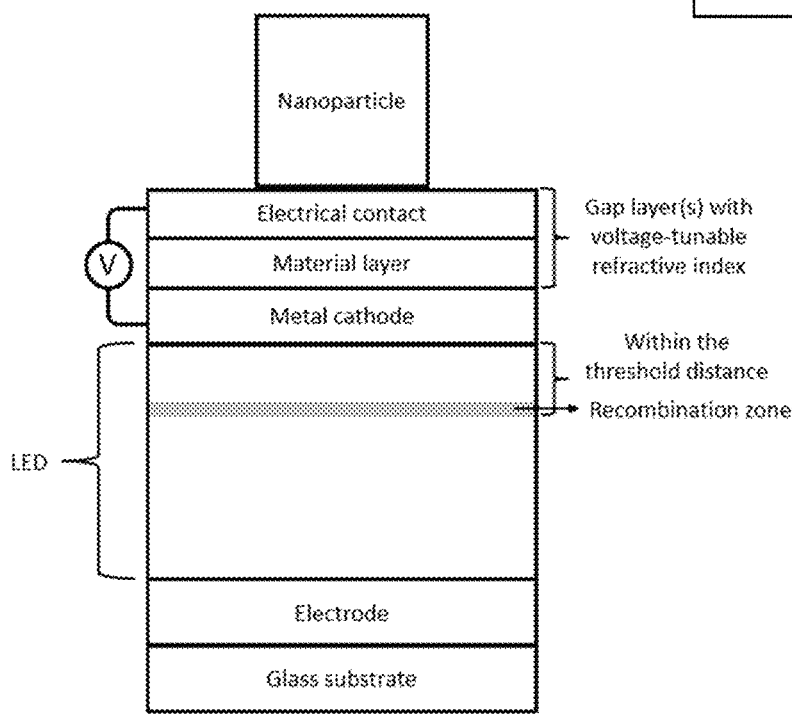
FIG. 14 shows a nanoparticle and enhancement layer arranged to form a nanoparticle based outcoupling element which uses a dielectric material with voltage-tunable refractive index for selecting the wavelength of emitted light as disclosed herein.

In some embodiments, an arrangement of nanoparticles, dielectric layer, and enhancement layer as disclosed herein may form a nanoparticle based outcoupling element. Examples of nanoparticle based outcoupling elements, which may also be referred to in prior publications as nanopatch antennas, are disclosed in further detail in U.S. Pat. No. 11,139,442 and U.S. Patent Publication Nos. 2021/0265584 and 2021/0249633, the disclosure of each of which is incorporated by reference in its entirety. Since the refractive index of the dielectric layer(s) (or dielectric spacer layer(s)) affects the resonance of the nanoparticle based outcoupling element, incorporating dielectric layer materials that have non-linear optical properties and/or voltage-tunable refractive index serves as a way to tune the emission spectrum with voltage applied between the metal cathode and an electrical contact layer beneath the nanoparticle, as shown in FIG. 14. In one example, aluminum-doped zinc oxide may be used as the voltage-tunable refractive index material since its permittivity is varied when an applied voltage modifies the carrier concentration. In this case, a second insulating layer is needed in the dielectric layer to build the charge, but such a secondary layer may not always be necessary depending on the material properties of the voltage-tunable refractive index layer. This is particularly useful when the OLED or LED is a white emitting, i.e., containing red, green, and blue emission, since the voltage-tunable nanoparticle based outcoupling element resonance can act as a color filter to selectively pass the desired color. This effectively converts the OLED or LED into a three-terminal device, with the voltage applied between the anode and cathode operating the OLED/LED, and the voltage applied between the cathode and the electrical contact layer beneath the nanoparticle tuning the nanoparticle based outcoupling element resonance to select the emitted color.

In the case of individual OLED or LED subpixels, for example in a display panel, the resonance of the nanoparticle outcoupling scheme may be purposely mismatched from the native emission of the device. In this way, the nanoparticle outcoupling scheme acts as a color filter to slightly shift the peak wavelength. In another embodiment, a resonance-mismatched nanoparticle outcoupling scheme may be used to narrow the emission spectrum. For example, a green OLED or LED paired with a blue resonant outcoupling scheme will see a narrowing by reducing the LEDs redder wavelengths. Conversely, pairing a green OLED or LED with a red resonance outcoupling scheme will see a narrowing by reducing the device's bluer wavelengths.

Figure 15A:
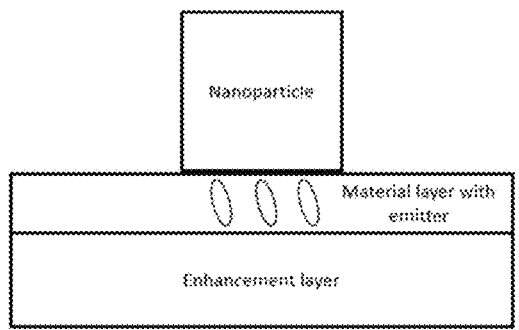
FIG. 15A, FIG. 15B, and FIG. 15C show examples of one or more emissive outcoupling layers in close proximity to the enhancement layer as disclosed herein.
Figure 15B:
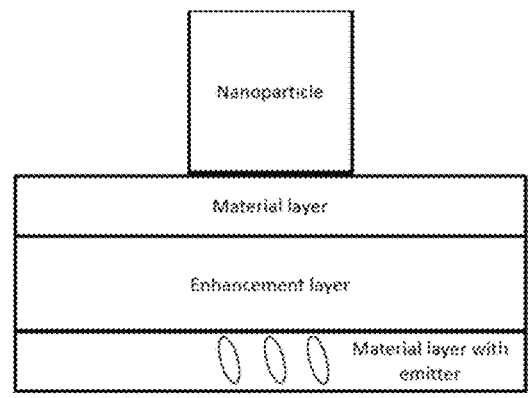
Figure 15C:
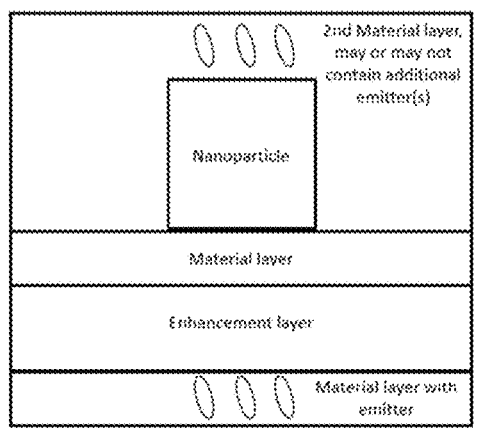

The device may include one or more emissive outcoupling layers in close proximity to the enhancement layer as shown in FIGS. 15A-15C, which may be used in conjunction with other emissive materials and layers elsewhere in the device as previously disclosed. FIG. 15A schematically shows a preferred nanoparticle based outcoupling architecture. The image depicts a dielectric layer with embedded emitters between the nanoparticle and enhancement layer. FIG. 15B shows a similar device architecture in which the emitters in the emissive layer are placed beneath the enhancement layer (i.e., not in the dielectric layer). FIG. 15C shows a variation of the design which includes a capping layer atop the nanoparticle, which may or may not contain additional emitters. This emissive outcoupling layers may contain an emissive material that can be excited by the energy of the surface plasmon polaritons in the nearby enhancement layer. The emissive material may be, but is not limited to, any organic emissive material as is known in the OLED field, a quantum dot, perovskite nanocrystals, metal-organic frameworks, covalent-organic frameworks, a thermally activated delayed fluorescence (TADF) emitter, a fluorescent emitter, or a phosphorescent organic emitter. It may be advantageous for the emissive material to have absorption and emission spectra demonstrating a small Stokes shift, such that only a small red-shift occurs between the LED excited state energy that is quenched into the enhancement layer and the emitted light from the emissive outcoupling layer(s). This preserves the emission color of the device. In another example device, the emissive material can be specifically chosen to down-convert a higher-energy excitation (eg. blue) to a lower-energy wavelength (eg. green or red). This enables a single LED structure to be utilized in every pixel of a display, with the color chosen by the emissive outcoupling layer. For example, this can be accomplished by depositing different-sized quantum dots in the outcoupling layer(s) of different pixels to tune the emission wavelength. The emissive outcoupling layer may or may not be combined with the nanoparticle based outcoupling scheme, in which case the emissive outcoupling layer would sit between the enhancement layer and the nanoparticle. In this case, the outcoupling efficiency may be enhanced even further as the radiative rate of the emissive material in the emissive outcoupling layer should be sped up.

The arrangement of the nanoparticles on the surface of the dielectric layer also may be selected to fit a specific device application. For example, a random arrangement of nanoparticles results in a nearly Lambertian emission profile, which may be preferable for use in lighting applications or display applications where point source emission is not desired. Inorganic LEDs tend to suffer from directional emission profiles thereby making the random nanoparticle array particularly attractive in certain applications. As another example, the nanoparticles may be arranged into an array as previously disclosed, thereby resulting in a dispersive emission profile that may be desired for some mobile applications or in applications that require the most outcoupling of light regardless of the angular dependence. Nanoparticles arranged into an array may achieve greater efficiencies than randomly arranged nanoparticles and selecting a specific array pitch and duty cycle will enable tuning of the array resonance and hence outcoupling wavelength at which the array has the largest efficiency.

Enhancement layers and/or nanoparticles as disclosed herein may include planar metals, stacks of metal layers and dielectric layers, stacks of metal layers and semiconducting layers, and perforated metal layers. The dielectric materials that suitable for use in the enhancement layer can include but are not limited to oxides, fluorides, nitrides, and amorphous mixtures of materials. The metal layers can include alloys and mixtures of metals from the following: Ag, Au, Al, Zn, Ir, Pt, Ni, Cu, W, Ta, Fe, Cr, Mg, Ga, Rh, Ti, Ca, Ru, Pd, In, Bi. The enhancement layer may be graphene or conductive oxides or conductive nitrides for devices outside the visible range.

An enhancement layer as disclosed herein may be patterned with nano-sized holes. The holes may be in an array or randomly or pseudo-randomly arranged. The size, shape, and orientation of the holes sets the frequency of light that can be outcoupled from the enhancement layer.

The enhancement layer may include a bullseye grating patterned on top of it. In some embodiments, the enhancement layer has a dielectric layer and then a bullseye grating patterned on top of the dielectric layer material.

In some embodiments the enhancement layer may be partially etched through to form nano-size outcoupling features on one side of the enhancement layer. In some embodiments, there are nano-sized features on both sides of the enhancement layer. In some cases when there are nano-sized features on both sides of the enhancement layer, the features smallest dimension will exceed 10 nm, in other cases it will exceed 20 nm, in other cases it will exceed 50 nm.

Device fabricated in accordance with the present invention can also include other components for controlling and manipulating light from the end product. These components include polarizers, color filters, and liquid crystals.

Inorganic LEDs used with embodiments disclosed herein may be fabricated from materials including but not limited to: GaAs, AlGaAs, GaAsP, AlGaInP, GaP, GaAsP, GaN, InGaN, ZnSe, SiC, $Si_3N_4$, Si, Ge, Sapphire, BN, ZnO, AlGaN, perovskites, and quantum dots (both electrically driven and as photoluminescent components). LEDs may be directly fabricated on a wafer and then pick and placed to create a larger electronic component module. Within the module, there may be additional LEDs which do not utilize the enhancement layer. In particular, devices based on electrically-driven excitonic quantum dots will also benefit from the increased optical density of states provided by the enhancement layer. The subsequent reduction in excited state lifetime may improve device stability. Further, plasmonic out-coupling may serve to select a specific range of emitted wavelengths, like a color filter, or may serve to narrow a broad emission spectrum, depending on the configuration of the nanoparticles in out-coupling scheme. Additionally, plasmon out-coupling efficiencies may exceed the current state-of-the-art in electrically-driven quantum dot devices. Further, the decrease in excited state duration due to the enhancement layer will in turn reduced roll-off in these devices as well as increase the operational stability.

The transition dipole orientation affects plasmon coupling efficiency and coupling distance, with coupling increasing as the dipole is more vertically oriented or has a higher VDR. Therefore, vertically oriented dipoles are most preferable for this device design. However, in practice, due to surface roughness of the enhancement layer, even perfectly horizontal dipoles will have some coupling efficiency to the plasmon mode.

In embodiments which use LEDs, the LEDs also may be combined with one or more phosphorescent emitters to produce to produce a wider range of colors from the LED e.g. white. The phosphor(s) may be placed a) in the epoxy used to encapsulate the LED or b) the phosphor can be placed remote from the LED. The phosphor acts as a 'down conversion' layer designed to absorb photons from the LED and reemit photons of a lower energy. Other down conversion materials that can used can be made of inorganic or organic phosphors, fluorescent, TADF, quantum dot, perovskite nanocrystals, metal-organic frameworks, or covalent-organic frameworks materials. Therefore, the embodiments of our invention that include enhancement layer and a nano size outcoupling scheme consisting of in one embodiment a metal, and a dielectric layer material, and a layer of nanoparticles can be placed between the inorganic LED and the phosphor or down conversion layer. The LED/metal a dielectric layer material/layer of nanoparticles device can be encapsulated with epoxy or a film containing the down conversion medium. The down conversion material can also be place outside of the LED/metal a dielectric layer material/ layer of nanoparticles encapsulation.

Other options to produce white light are the use homoepitaxial ZnSe blue LED grown on a ZnSe substrate, which simultaneously produces blue light from the active region and yellow emission from the substrate and GaN on Si (or SiC or sapphire) substrates. This invention can be combined with these devices.

Devices fabricated in accordance with embodiments of this invention can also be combined with QNED technology in which GaN-based blue light emitting nanorod LEDs replace discreet inorganic LEDs as the pixelated blue light sources in a display.

The dielectric layer/nanoparticle outcoupling layer arrangement disclosed herein may be combined with a spacer (or surface plasmon amplification by stimulated emission of radiation or plasmonic laser), or surface plasmon polariton (SPP) spacers or nanolasers, and will convert the plasmon energy back into photons.

In some embodiments, the LEDs formed with the enhancement layer and outcoupling scheme may be directly patterned on a wafer or substrate which then is incorporated into the electronic component module. In these cases, if one wishes to eliminate devices which are not in specification (for example, ideal peak wavelength) they can be eliminated by not including the outcoupling layer on the device since inclusion of the enhancement layer will make the LED more dim. In some embodiments of patterning a R,G,B full color module on a single substrate, at least one color sub-pixel will have the enhancement layer and outcoupling scheme.

According to an embodiment, a light emitting diode/device (LED) is provided. The LED can include a substrate, an anode (or p-type contact), a cathode (n-type contact), and recombination zone disposed between the anode and the cathode and an enhancement layer. According to an embodiment, the light emitting device is incorporated into one or more device selected from a consumer product, an electronic component module, a lighting panel, and/or a sign or display.

It is understood that the various embodiments described herein are by way of example only, and are not intended to limit the scope of the invention. For example, many of the materials and structures described herein may be substituted with other materials and structures without deviating from the spirit of the invention. The present invention as claimed may therefore include variations from the particular examples and preferred embodiments described herein, as will be apparent to one of skill in the art. It is understood that various theories as to why the invention works are not intended to be limiting.

We claim:

1. A device comprising:
   a substrate;
   a first electrode disposed over the substrate;
   an emissive layer comprising an emissive material and disposed over the first electrode;
   an outcoupling layer disposed over the emissive layer and comprising a plurality of nanoparticles; and
   one or more dielectric materials disposed at least partially between the outcoupling layer and the emissive layer;
   wherein the outcoupling layer has at least three regions possessing distinct bulk refractive index values.

2. The device of claim 1, wherein the emissive material comprises an organic emissive material.

3. The device of claim 1, further comprising an enhancement layer disposed between the first electrode and the dielectric layer, the enhancement layer comprising a plasmonic material exhibiting surface plasmon resonance that non-radiatively couples to the emissive material and transfers excited state energy from the emissive material to a non-radiative mode of surface plasmon polaritons.

4. The device of claim 3, wherein the one or more dielectric materials extend in a dielectric layer between the outcoupling layer and the enhancement layer.

5. The device of claim 3, wherein the enhancement layer is a second electrode of the device.

6. The device of claim 1, wherein one of the distinct bulk refractive index values is provided by the nanoparticles.

7. The device of claim 1, wherein one of the distinct bulk refractive index values is provided by a portion of the one or more dielectric materials disposed between at least some of the nanoparticles.

8. The device of claim 1, wherein at least some of the nanoparticles are coated with a surrounding ligand.

9. The device of claim 8, wherein one of the distinct bulk refractive index values is an effective refractive index of the nanoparticles coated with the surrounding ligand.

10. The device of claim 1, wherein the one or more dielectric materials extend in a dielectric layer between the outcoupling layer and the emissive layer.

11. The device of claim 10, wherein the dielectric layer extends across a plane that separates the entirety of the outcoupling layer from the entirety of a layer immediately below the dielectric layer.

12. The device of claim 10, wherein the dielectric layer has a variable thickness.

13. The device of claim 10, wherein the dielectric layer:
   comprises a portion that extends through and above the outcoupling layer;
   comprises a portion that extends into the outcoupling layer and between nanoparticles in the outcoupling layer;
   comprises a portion that extends to a maximum distance away from the electrode that is closer to the electrode than the bottom of the outcoupling layer;
   comprises a portion that extends exactly to the bottom of the outcoupling layer;
   or any combination thereof.

14. The device of claim 1, wherein the dielectric layer comprises a plurality of sub-units.

15. The device of claim 14, wherein at least some sub-units comprise different materials, have different thicknesses, or a combination thereof, relative to other sub-units.

16. The device of claim 14, wherein at least some sub-units have one or more different material properties than other sub-units.

17. The device of claim 16, wherein the at least some sub-units have different refractive indices, surface energy, or a combination thereof, relative to other sub-units.

18. A consumer electronic product comprising:
   a device comprising:
     a substrate;
     a first electrode disposed over the substrate;
     an emissive layer comprising an emissive material and disposed over the first electrode;
     an outcoupling layer disposed over the emissive layer and comprising a plurality of nanoparticles; and
     one or more dielectric materials disposed at least partially between the outcoupling layer and the emissive layer;
   wherein the outcoupling layer has at least 3 regions possessing distinct bulk refractive index values.

19. The device of claim 18, wherein the consumer electronic product is at least one type selected from a group consisting of: display screens, lighting devices including discrete light source devices or lighting panels, flat panel displays, curved displays, computer monitors, medical monitors, televisions, billboards, lights for interior or exterior illumination and/or signaling, heads-up displays, fully or partially transparent displays, flexible displays, rollable displays, foldable displays, stretchable displays, laser printers, telephones, cell phones, tablets, phablets, personal digital assistants (PDAs), wearable devices, laptop computers, digital cameras, camcorders, viewfinders, micro-displays that are less than 2 inches diagonal, 3-D displays, vehicle, aviation displays, a large area wall, a video walls comprising multiple displays tiled together, theater or stadium screen, a light therapy device, a sign, augmented reality (AR) or virtual reality (VR) displays, displays or visual elements in glasses or contact lenses, light emitting diode (LED) wallpaper, LED jewelry, and clothing.

20. A method of fabricating a device as recited in claim 1, the method comprising one or more techniques selected from the group consisting of: one or more physical vapor deposition (PVD) processes, lithography, or a combination thereof.

* * * * *